(12) United States Patent
Kawahara et al.

(10) Patent No.: US 7,469,365 B2
(45) Date of Patent: Dec. 23, 2008

(54) METHOD AND DEVICE FOR INTERLEAVING AND METHOD AND DEVICE FOR DE-INTERLEAVING

(75) Inventors: Toshiro Kawahara, Kanagawa (JP); Toshio Miki, Kanagawa (JP); Sanae Hotani, Kanagawa (JP); Takashi Suzuki, Kanagawa (JP)

(73) Assignee: NTT Mobile Communications Network, Inc., Tokyo (JP)

( * ) Notice: Subject to any disclaimer, the term of this patent is extended or adjusted under 35 U.S.C. 154(b) by 141 days.

(21) Appl. No.: 11/541,228

(22) Filed: Sep. 29, 2006

(65) Prior Publication Data

US 2007/0038903 A1    Feb. 15, 2007

Related U.S. Application Data

(63) Continuation of application No. 10/885,992, filed on Jul. 6, 2004, now Pat. No. 7,191,369, which is a continuation of application No. 09/462,773, filed as application No. PCT/JP99/02799 on May 27, 1999, now Pat. No. 6,871,302.

(30) Foreign Application Priority Data

May 27, 1998 (JP) .................................. 10-146191
Dec. 4, 1998 (JP) .................................. 10-346016

(51) Int. Cl.
*G06F 11/00* (2006.01)
*G06F 12/16* (2006.01)

(52) U.S. Cl. ...................................... 714/701; 711/157

(58) Field of Classification Search ................... 714/701
See application file for complete search history.

(56) References Cited

U.S. PATENT DOCUMENTS 4,559,625 A    12/1985    Berlekamp et al.
(Continued)

FOREIGN PATENT DOCUMENTS

EP    0 603 932 A1    6/1994
(Continued)

OTHER PUBLICATIONS

Office Action issued May 1, 2007 in the U.S. Appl. No. 11/540,059.
(Continued)

*Primary Examiner*—Cynthia Britt
(74) *Attorney, Agent, or Firm*—Brinks Hofer Gilson & Lione

(57) ABSTRACT

The writing address supply part 210 supplies writing addresses for writing the bits forming bit sequences corresponding to the header H contained in a frame to be transmitted or stored and bit sequences corresponding to the data D, into the operating memory 220. The reading address supply part 230 alternately supplies to the operating memory 220 a plurality of addresses for reading a plurality of continuous bits corresponding to the header H from the operating memory 220, and an address for reading 1 bit corresponding to the data D from the operating memory 220, and reads the bit sequence such that the bits forming the bit sequence corresponding to the header H are scattered and arranged within the bit sequence forming the data D, from the operating memory. In accordance with such an interleaving device, it is possible to individually randomize frames according to their constituent data, and it is possible to transmit the bits that make up such data in a format which is most suited for said data.

8 Claims, 19 Drawing Sheets

WRITING ORDER AT THE TIME OF INTERLEAVING
(READING ORDER AT THE TIME OF DE-INTERLEAVING)

220 (320)

U.S. PATENT DOCUMENTS

| | | | |
|---|---|---|---|
| 5,022,029 | A | 6/1991 | Guichon |
| 5,255,343 | A | 10/1993 | Su |
| 5,351,246 | A | 9/1994 | Blaum et al. |
| 5,517,511 | A | 5/1996 | Hardwick et al. |
| 5,572,681 | A | 11/1996 | Nakamura et al. |
| 5,623,504 | A | 4/1997 | Tolhuizen |
| 5,642,365 | A | 6/1997 | Murakami et al. |
| 5,666,370 | A | 9/1997 | Ganesan et al. |
| 5,729,560 | A | 3/1998 | Hangenauer et al. |
| 5,751,741 | A | 5/1998 | Voith et al. |
| 5,757,822 | A | 5/1998 | Fisher et al. |
| 5,764,649 | A | 6/1998 | Tong |
| 5,805,469 | A | 9/1998 | Okamoto et al. |
| 5,862,175 | A | 1/1999 | Sugiyama et al. |
| 5,898,698 | A | 4/1999 | Bross |
| 5,907,560 | A | 5/1999 | Spruyt |
| 5,946,357 | A * | 8/1999 | Sandin et al. ............... 375/296 |
| 5,978,883 | A | 11/1999 | Hanna ........................... 711/5 |
| 6,151,690 | A | 11/2000 | Peeters |
| 6,154,661 | A | 11/2000 | Goldburg |
| 6,192,493 | B1 | 2/2001 | Combelles et al. |
| 6,282,677 | B1 | 8/2001 | Inoue |
| 6,434,718 | B1 | 8/2002 | Kawahara et al. |
| 6,826,181 | B1 | 11/2004 | Higashida et al. ........... 370/390 |
| 2007/0038902 | A1 | 2/2007 | Kawahara et al. |

FOREIGN PATENT DOCUMENTS

| | | |
|---|---|---|
| EP | 0 749 211 A2 | 12/1996 |
| JP | 408097731 A | 4/1996 |
| JP | 09-130269 A | 5/1997 |
| JP | 09-161417 A | 6/1997 |
| JP | 409331538 A | 12/1997 |
| WO | WO 95/16311 | 6/1995 |
| WO | WO 96/27962 | 9/1996 |
| WO | WO97/08836 | 3/1997 |

OTHER PUBLICATIONS

Sasaki, G. et al., "Scheduling Data Transfers in Preemptive Hierarchical Switching Systems with Applications to Packet Radio Networks", *One World Through Communications*, May 4, 1992, IEEE vol. 2, Conf.11, pp. 691-700.

Frater, M. R. et al., "Wireless Video: The Impact of the Multiplexing Layer on Error Resilience", *First International Workshop on Wireless Image/Video Communications*, Sep. 4, 1996, IEEE, pp. 20-25.

Chi, D., "A New Block Helical Interleaver", *Military Communications Conference*, Oct. 11, 1992, IEEE, pp. 799-804.

EPO Office Action dated May 31, 2006.

English Translation of Makoto Yamamoto et al., "A Variety of Multiplexing Methods in Which Various Data is Combined and Transmitted," *Electronics Life*, Jan. 1994, pp. 60-74 (18 pages).

Lim, Sung Ho et al. "Impact of Cell Unit Interleaving on Header Error Control Performance in Wireless ATM," Global Telecommunications Conference, 1996. Globecom '96. Communications: The Key to Global Prosperity London, UK Nov. 18-22, 1996, New York, NY, USA, *IEEE*, US, Nov. 18, 1996, 1705-1709.

Tolstrup, Nielsen P. "Distributed Frame Synchronisation by Nonlinear-Shift-Register Sequences," *Electronics Letters*, Feb. 22, 1973, vol. 9, No. 4, 73-75.

English abstract of JP 63-182977, *Patent Abstracts of Japan*, Jul. 28, 1988, vol. 0124, No. 57, one page.

A. J. van Wihngaarden et al. "Combinatorial Construction of High Rate Runlength-Limited Codes," Global Telecommunications Conference, 1996. Globecom '96. Communications: The Key to Global Prosperity London, UK Nov. 18-22, 1996, New York, NY, USA, *IEEE*, US, Nov. 18, 1996, 343-347.

Makoto Yamamoto, et al., "Iroiro na jouhou o kasanete okuru tajuu houhou no iroiro", *Electronics Life*, Jan. 1994, Nippon Housou Shuppan Kyoukai, pp. 60-74.

A.R. Calderbank and N. Seshadri. "Multilevel Codes for Uneaqual Error Protection", Calderbank et al. IEEE Transactions on Information Theory, vol. 39, No. 4, pp. 1234-1248, Jul. 1993.

* cited by examiner

WRITING ORDER AT THE TIME OF INTERLEAVING
(READING ORDER AT THE TIME OF DE-INTERLEAVING)

READING ORDER AT THE TIME OF INTERLEAVING
(WRITING ORDER AT THE TIME OF DE-INTERLEAVING)

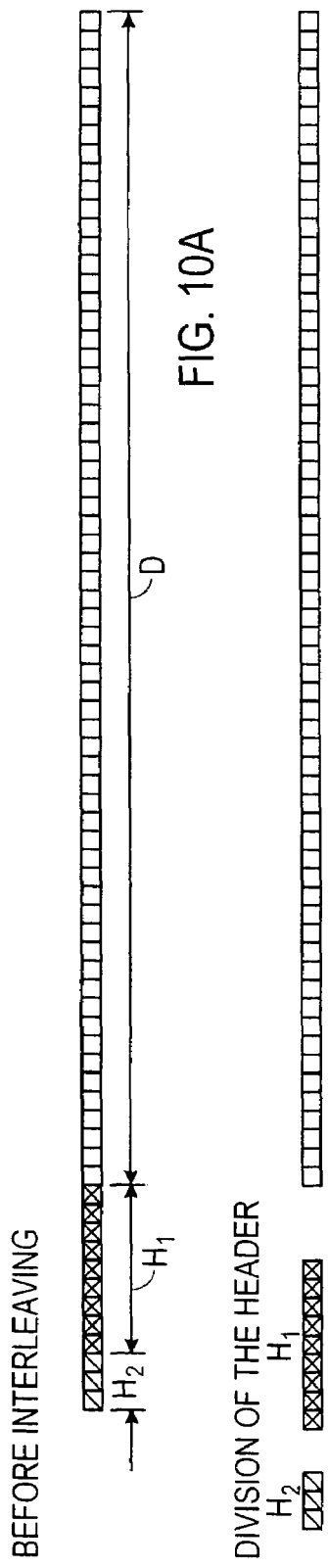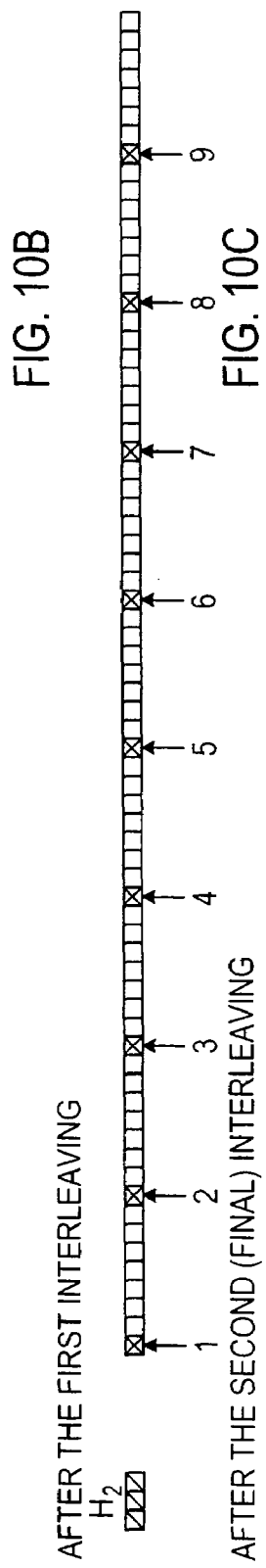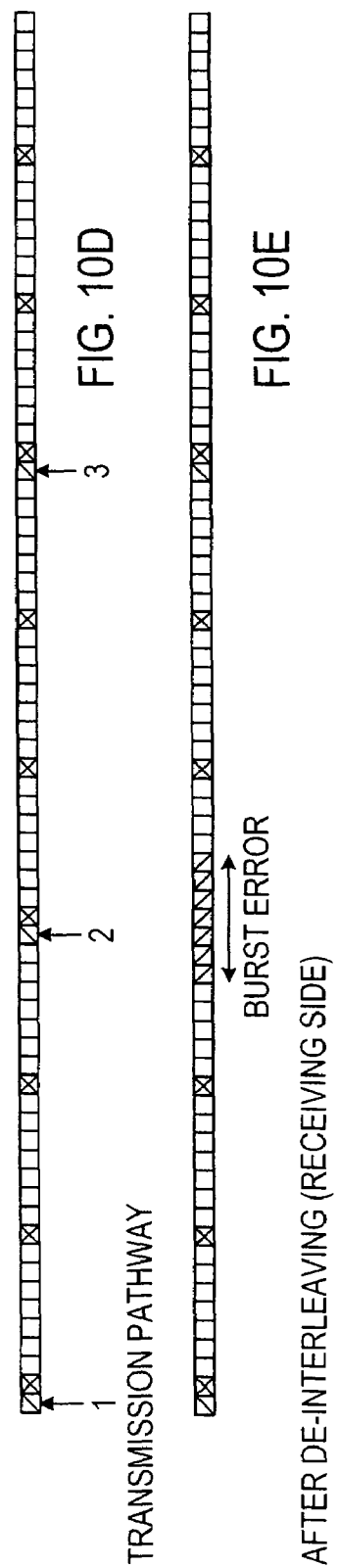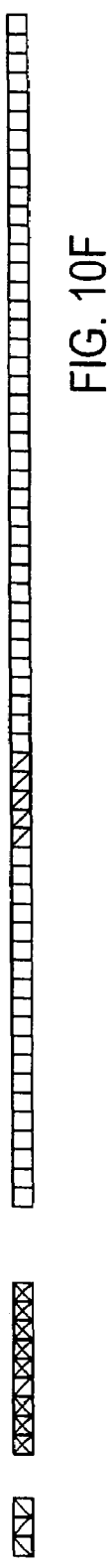
FIG. 10A BEFORE INTERLEAVING
FIG. 10B DIVISION OF THE HEADER
FIG. 10C AFTER THE FIRST INTERLEAVING
FIG. 10D AFTER THE SECOND (FINAL) INTERLEAVING
FIG. 10E TRANSMISSION PATHWAY
FIG. 10F AFTER DE-INTERLEAVING (RECEIVING SIDE)

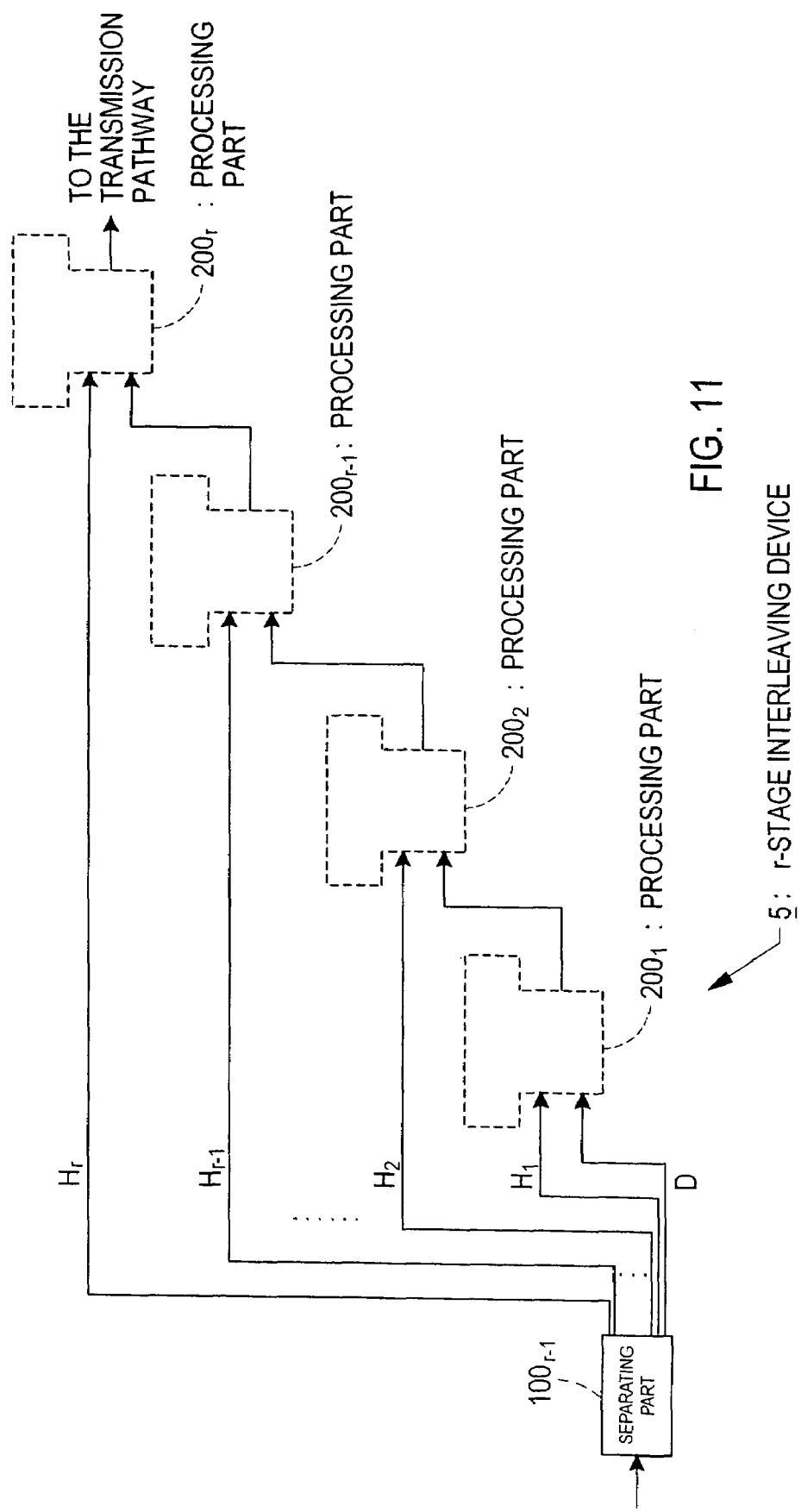

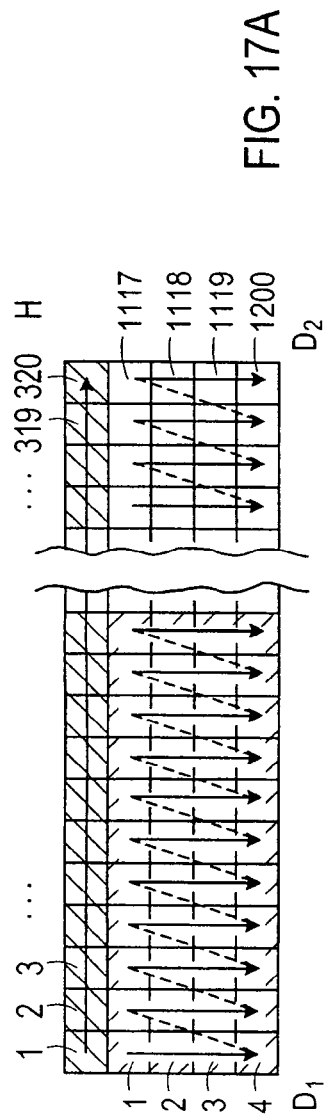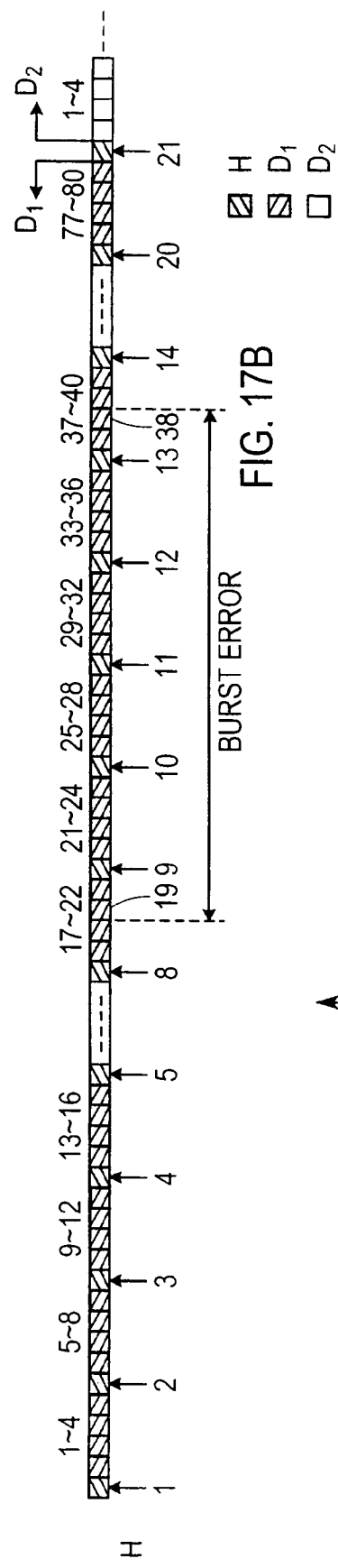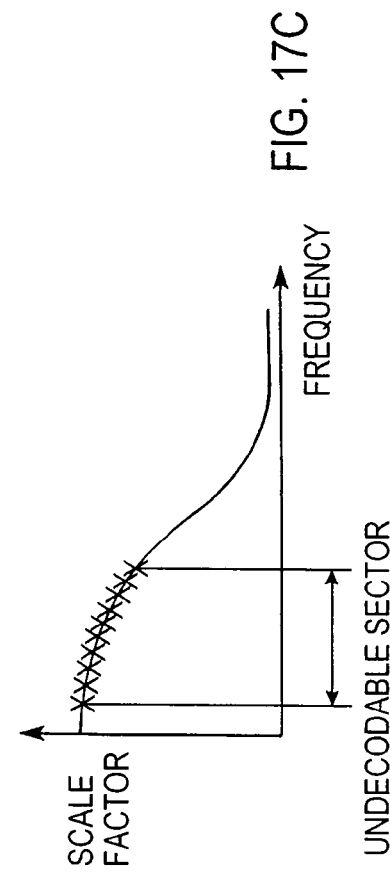
FIG. 17A
FIG. 17B
FIG. 17C

METHOD AND DEVICE FOR INTERLEAVING AND METHOD AND DEVICE FOR DE-INTERLEAVING

RELATED APPLICATIONS

This application is a continuation of application Ser. No. 10/885,992 filed Jul. 6, 2004, now U.S. Pat. No. 7,191,369 which is a continuation of application Ser. No. 09/462,773 filed Jan. 10, 2000, now U.S. Pat. No. 6,871,302, which is the National Stage of PCT Application No. PCT/JP99/02799 filed May 27, 1999, which claims priority to Japanese Application Nos. 10-146191 filed May 27, 1998 and 10-346016 filed Dec. 4, 1998. The entire contents of all of these applications are incorporated herein by reference.

TECHNICAL FIELD

This invention relates to a method for interleaving and a device for interleaving used in transmitters for digital telecommunications systems and digital recording devices for recording digital data in recording media, and this invention also relates to a method for de-interleaving and a device for de-interleaving used in receivers for digital telecommunications systems and devices for reproducing digital data from recording media.

BACKGROUND ART

In digital telecommunications systems that transmit digital data, signal errors can be generated in digital data in the process of transmission, so encoding is carried out through the use of error-correcting codes for the digital data to be sent.

If the number of erroneous bits in one code word is kept below a specified value when creating these error-correcting codes, then it is possible to correct all of the errors at the time of error-correcting decoding on the receiving side. The number of bits that can be corrected per code word is known as the error correcting capacity of the error-correcting code.

Although the average code error rate itself is low in telecommunications environments such as mobile telecommunications, burst errors readily occur. Consequently, even if data is transmitted with error correction encoding, burst errors often occur with the number of consecutive bits exceeding the error correcting capacity.

For this reason, the use of error-correcting codes in mobile telecommunications environments is less effective than in telecommunications environments where random code errors are generated. Accordingly, interleaving is used to solve this problem.

Interleaving is a technique for scrambling the order of a bit sequence that is to be sent, so as to transmit the bits in a sequence that differs from the original order.

The method of interleaving is described here with one example, using as a unit a bit sequence of m×n bits consisting of a collection of m code words formed from n bits. It should be noted that for the sake of convenience, a bit sequence for one instance of interleaving shall be referred to as a frame.

Generally speaking, interleaving utilizes memory. In this example, interleaving is carried out through the use of a continuous storage area of m×n in memory.

FIG. 20 shows this interleaving storage area expressed as a two-dimensional memory space. The storage areas in this memory space are specified by address data with a specified number of bits formed from a lower address that can take n combination of values and an upper address that can take m combination of values. In FIG. 20, storage areas with identical upper addresses are arranged from left to right in lower address sequence, and storage areas with identical lower addresses are arranged from top to bottom in upper address sequence. It should be noted that hereinafter, for the sake of convenience, a series of storage areas with identical upper addresses shall be called rows, and a series of storage areas with identical lower addresses shall be called columns.

When implementing interleaving, first of all, the bit sequences in question are each to be written sequentially in their respective m×n storage area, one bit at a time. When carrying out this writing, the writing addresses are generated by an address-generating circuit such as shown in FIG. 21, for example. This address-generating circuit is formed from an n-scale counter 11 and an m-scale counter 12. Here, the n-scale counter 11 conducts a count of the bit clock synchronous with the input timing of the bits that are to be interleaved. The m-scale counter 12 increases the count value by "1" for each nth change in the count value of the n-scale counter 11. In addition, the writing address consisting of the count value of the n-scale counter 11 as the lower address and the count value of the m-scale counter 12 as the upper address is provided to the memory shown in FIG. 20, and these are written to memory.

Consequently, as shown in FIG. 22, the code word of the initial n bit in the bit sequence is written in the first row in the memory space, the next code word is written in the second row, and so forth, so that ultimately, the mth code word is written in the mth row.

Next, the various bits that are thusly written into memory are read in an order that differs from when they were written.

In this reading operation, a reading address is generated by the address-generating circuit shown in FIG. 23. In the configuration shown in FIG. 23, a count of bit blocks is conducted by an m-scale counter 22, and this m-scale counter 22 increases the count value by "1" for each mth change in the count value of an n-scale counter 21. In addition, the reading address consisting of the lower address with the count value of the n-scale counter 21 and the upper address with the count value of the m-scale counter 22 is supplied to the memory for interleaving synchronously with the bit block, and readout of memory is implemented.

Consequently, as shown in FIG. 24, the m bits recorded in each storage area of the first column of the memory space are read in the upper address sequence, then the m bits recorded in each storage area of the second column are read in the upper address sequence, and so forth, so that ultimately, the m bits recorded in each storage area of the n column are read in the upper address sequence.

Accordingly, the bits forming the code words are distributed over the entire area within the frame by virtue of the fact that the code words forming the frame are written into memory, and by virtue of the fact that the bits forming the code words are read in a sequence that differs from when they were written. In further detail, as a result of interleaving, the n bits forming the code words are scattered and arranged within the frame in such a state that they are separated by inserting them between the m-1 bits belonging to other code words.

After implementing such interleaving, the frame is delivered to the transmission pathway.

When the receiving side receives the frame via the transmission pathway, a scrambling operation is executed which is the reverse of interleaving, thereby recovering the frame with the bit sequence in the original order. This scrambling operation occurring on the receiving side is known as de-interleaving.

When frames are transmitted using a transmission method that deploys such interleaving and de-interleaving, it becomes easy to correct signal errors on the receiving side, even if the burst errors occur in the frames during the transmission process.

A more detailed description is given below.

First, suppose that a burst error with a bit length of m×k occurs in an interleaved frame during the transmission process.

Here, a burst error occurring with a bit length of m×k contains k bits each per code word, said bits forming m code words. Accordingly, bits that are affected by burst errors in the m code words recovered by de-interleaving are only k bits per code word. That is to say, said code error becomes a random code error for the frame after de-interleaving.

Therefore, in cases where error correction encoding of code words is performed through the use of error-correcting codes capable of correcting errors numbering more than k bits, it becomes possible to correct all signal errors on the receiving side even if burst errors occur with a bit length of m×k.

It should be noted here that, for the sake of convenience, the effect which is brought about by interleaving is referred to below as randomization of burst errors, or simply as randomization.

In cases where the number m of code words making up a frame is large, the number of erroneous bits per code word can be reduced, even if burst errors are generated that have high bit lengths. In this sense, it may well be the case that, the greater the number m of code words making up the frame, the greater the randomization effect imparted by interleaving.

However, since it is necessary to store at least one frame's worth of bits in order to deploy interleaving on the transmission side and de-interleaving on the receiving side, respectively, a delay unavoidably occurs. Accordingly, the frame length for interleaving must be selected in such a way as to reduce the delay. To this end, it is considered desirable to set a frame length as an interleaving processing unit that is equal to the frame length set by the CODEC and the like.

Incidentally, in the case of digital transmission of data such as voice and images, there are instances where the bit sequence forming one frame that serves as the unit of transmission is composed of a header that has undergone error correction encoding and a portion that has not undergone error correction encoding. When said interleaving is executed with respect to the entire bit sequence forming such a single frame, the following problems occur since randomization of burst errors is also carried out on portions that have not undergone error correction encoding.

(1) Problem 1

In the case of a CODEC that handles data such as voice and the like, when errors are predicted to occur in portions that have not undergone error correction encoding, an operation is executed that is known as concealment, whereby said portion is substituted into a non-sound sector. It is more desirable that the signal errors be concentrated, so that such an operation is executed appropriately. Thus, randomization due to interleaving is not desirable in relation to portions that have not undergone error correction encoding.

(2) Problem 2

In order to optimize the effect of randomization due to interleaving, it is desirable to deploy interleaving while using as a standard the bit length n of the code words that have undergone error correction encoding, and widely scattering the n bits forming each code word within one frame. However, in actual practice, different types of error correction encoding are executed, depending on the type of data to be transmitted, and there are many cases where one frame is formed from a plurality of types of code words (or error correction codes). In such cases, a sufficient randomization effect can be realized with regard to a specified error correction code when interleaving is deployed across an entire frame using as a standard the code length of said specified error correction code within the frame, but there arises the problem that a sufficient randomization effect is not realized with regard to other error correction codes with different code lengths.

(3) Problem 3

The determination of whether randomization is advantageous or not does not depend only on whether or not there is data that has undergone error correction encoding. That is to say, in frames formed from bit sequences that have undergone error correction encoding and bit sequences that have not undergone error connection encoding, there are cases where those bit sequences that have not undergone error correction encoding are, by their nature, either formed in response to data which should be randomized, or formed in response to data which should not be randomized. For each datum forming a frame, it would be advantageous to determine whether or not randomization is appropriate by seeking an approach that suits the nature of the data in question, but until now, no technological means have been provided for this purpose.

DISCLOSURE OF INVENTION

The present invention was devised in light of the above-described state of affairs, and has as its object to provide an interleaving method, interleaving device, de-interleaving method, and de-interleaving device which make it possible to transmit bits that form data in a suitable configuration for said data by executing separate randomization for each datum forming a frame.

In order to achieve this object, the present invention provides an interleaving method and a corresponding de-interleaving method, characterized by scattering and arranging the bits forming bit sequences corresponding to a second datum contained in a frame within the bit sequence corresponding to a first datum contained within said frame to be transmitted or recorded.

In accordance with the disclosed invention, it is possible to suitably transmit various data, since the randomization effect due to interleaving only extends to the second datum.

BRIEF DESCRIPTION OF DRAWINGS

FIGS. 10A-10F are time charts showing the operation of said embodiment.

FIG. 11 is a block diagram showing a general configuration of a multi-stage interleaving device relating to said embodiment.

FIGS. 17A-17C are diagram describing the interleaving method in Comparative Example 1 presented in contrast to said embodiment, and the resistance to signal errors of said of said method.

BEST MODE FOR CARRYING OUT THE INVENTION

Following is a description of embodiments of the present invention, presented with reference to drawings.

A. First Embodiment (1) The Interleaving Device

Figure 1:
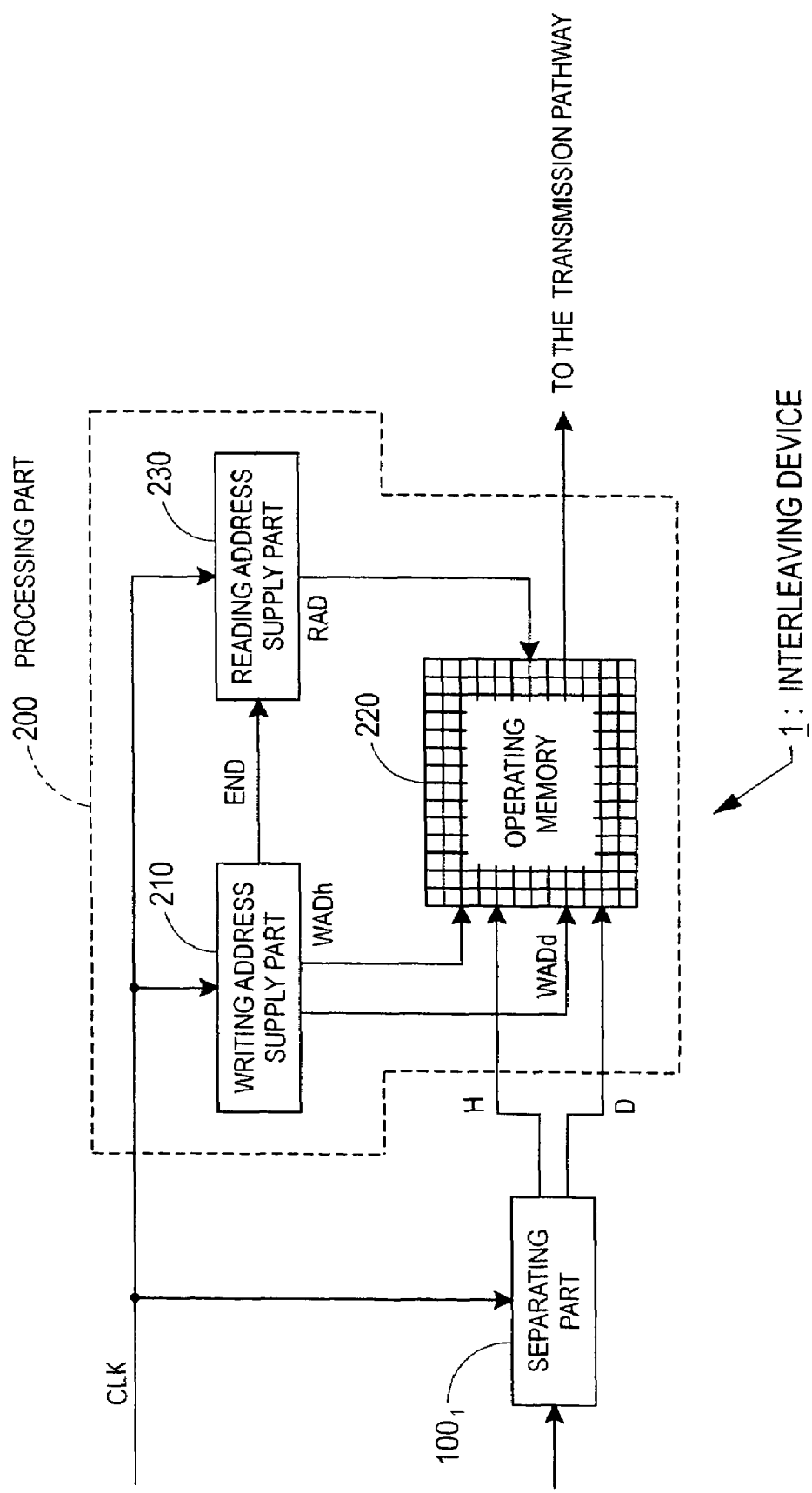
FIG. 1 is a block diagram showing a configuration of an interleaving device of the first embodiment of this invention.

FIG. 1 is a block diagram showing a configuration of an interleaving device 1 provided to a device on the transmission side of a digital telecommunications system which is the first embodiment of this invention.

As shown in FIG. 1, this interleaving device comprises a separating part 100, and a processing part 200.

The frames that are to be transmitted to the receiving side device are sequentially transmitted to the interleaving device 1. Each frame is a bit sequence formed from a plurality of bits, and these bits are sequentially supplied to the interleaving device 1 synchronously with a bit clock CLK.

When the data forming the frames are divided by category, it is possible to distinguish between the header H and the data D which follows it.

In the example described below, the header H is formed from p bits, and the data D is formed from m×p bits.

Furthermore, the header H undergoes error correction encoding. By contrast, the data D does not undergo error correction encoding.

The separating part 100, is a device for separating each of the frames that are supplied sequentially into the header H and the data D, and outputting them. This separation can be carried out in accordance with a method as described, for example, as follows. That is to say, the number of bits supplied synchronously with the bit clock CLK are counted, and the portion from the initial bit to the p bit is taken as the header H, and the subsequent parts are taken as the data D.

The processing part 200 is a device that receives the header H and the data D from the separating part $100_1$, scattering and arranging the bits forming the header H within the data D. This processing part 200 has as its principal component elements a writing address supply part 210, an operating memory 220, and a reading address supply part 230.

Here, the operating memory 220 is a storage device for recording bits forming the frame to be interleaved. In the present embodiment, a continuous plurality of storage areas with addresses are selected for use from all of the storage areas of the operating memory 220, and the various bits forming one frame are stored in the storage areas.

Interleaving consists of the process of sequential writing of bits forming frames to this operating memory 220, and the process of reading the bits from this operating memory 220 in a sequence that differs from when they were written.

The writing address supply part 210 is a device that executes a specified address-generating program in order to generate synchronously with the time clock CLK a writing address WADh that specifies the writing destination of the bits forming the header H, and a writing address WADd that specifies the writing destination of the bits forming the data D, and supplies them to the operating memory 220, when the bits forming a frame are written to the operating memory 220.

Furthermore, when all of the writing addresses needed for writing the bits forming one frame into the operating memory 220 are no longer being generated, the END signal indicating this is supplied to the reading address supply part 230.

The reading address supply part 230 is a device that generates the reading address RAD for reading the bits recorded in the operating memory 220, generating it synchronously with the bit clock CLK according to a specified address-generating program when the END symbol is received, and supplies the reading address RAD to the operating memory 220.

Figure 2:
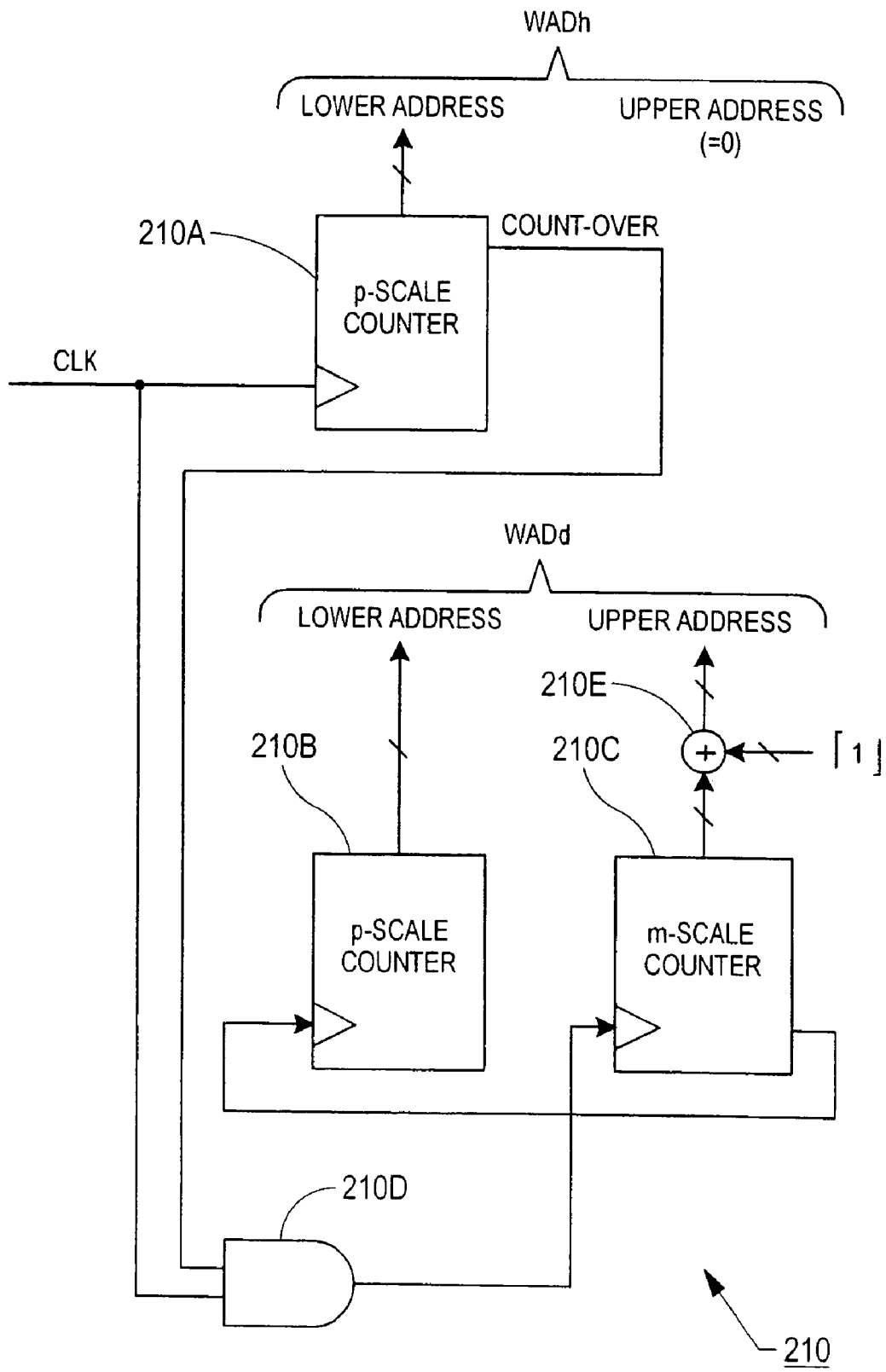
FIG. 2 is a block diagram showing an example of a configuration of the writing address supply part of said interleaving device.

FIG. 2 is a block diagram showing the address-generating algorithms of the writing address supply part 210 from the standpoint of hardware.

The address-generating algorithm of this writing address supply part 210 is formed from a p-scale counter 210A, a p-scale counter 210B, an m-scale counter 210C, an AND gate 210D, and an adder 210E. Here, the p-scale counter 210A counts the bit clock CLK. The writing address WADh for the bits forming the header H is a lower address with a counter value of the p-scale counter 210A, and an upper address designated as "0".

The p-scale counter 210A stops the counting of the bit clock CLK when the count value changes p number of times, yielding a count-over.

The AND gate 210D supplies the bit clock CLK to the m-scale counter 210C, after the p-scale counter 210A yields a count-over.

The m-scale counter 210C carries out counting of the bit clock CLK supplied via this AND gate 210D. The count value yields a count-over when it changes m times, but after that, as long as the bit clock CLK is supplied, the count is repeated again from the initial value "0". The p-scale counter 210B adds counting values "1" at a time each time the m-scale counter 210C counts over. The adding machine 210E adds "1" to the count value of the m-scale counter 210C.

The writing address WADd that specifies the writing destination of the bits forming the data D is such that the count value of the p-counter 210B is a lower address and the output data of the adding machine 210E is an upper address.

Figure 3:
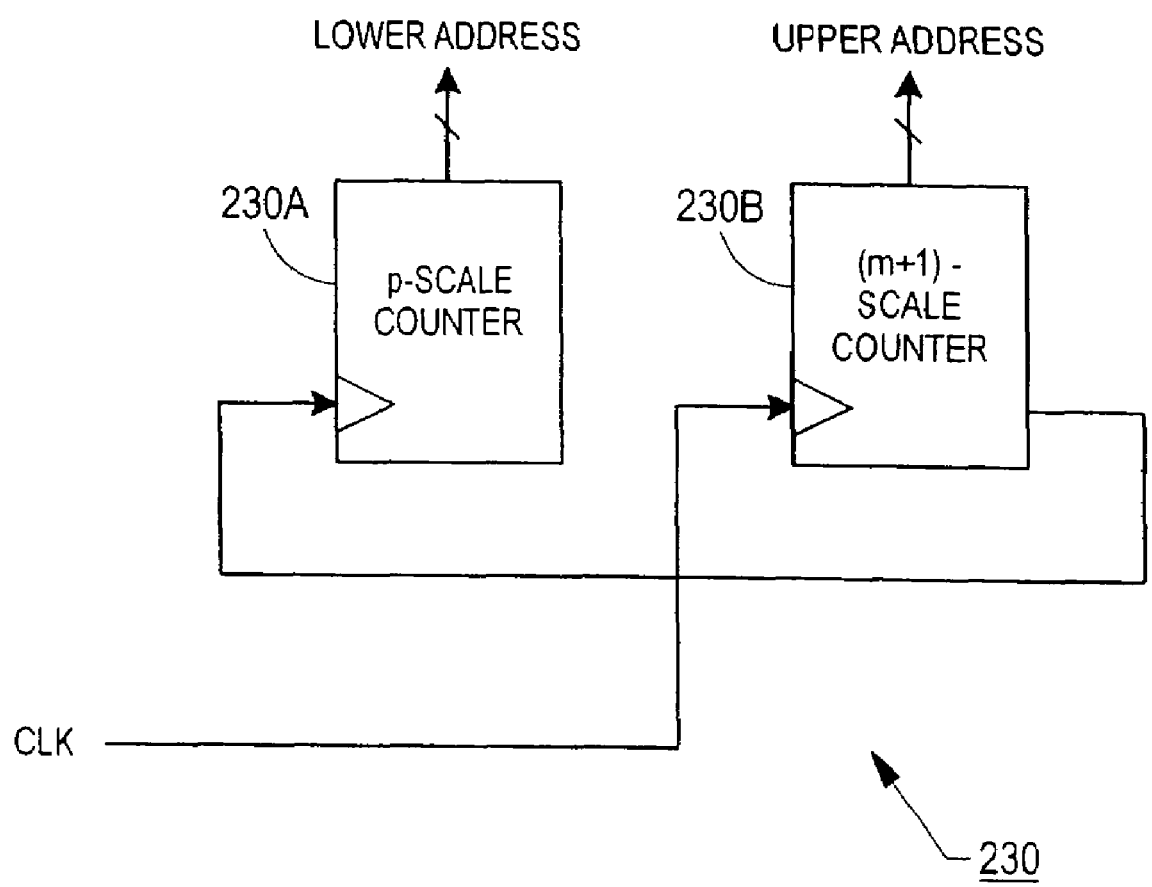
FIG. 3 is a block diagram showing an example of a configuration of the reading address supply part of said interleaving device.

FIG. 3 is a block diagram showing the address-generating algorithms of the reading address supply part 230 from the standpoint of hardware. The address-generating algorithm of this reading address supply part 230 is formed by a p-scale counter 230A and an (m+1)-scale counter 230B. The (m+1)-scale counter 230B carries out counting for the bit clock CLK. The count of the p-scale counter 230A is increased by one when the count of the (m+1)-scale counter 230B changes m+1 times and is initialized to the initial value "0".

The read address RAD is such that the count value of this p-scale counter 230A is a lower address, and the count value of the (m+1)-scale counter 230B is an upper address.

The above is a detailed description of the configuration of the interleaving device 1.

Figure 4:
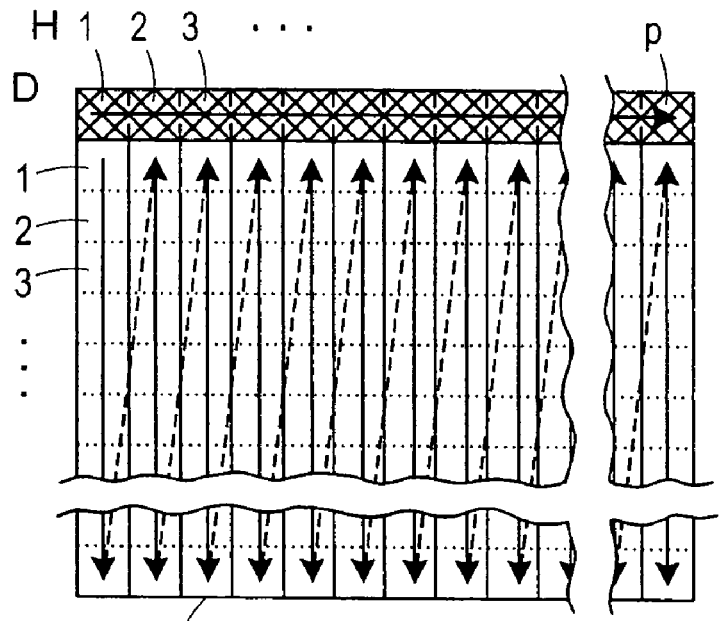
FIG. 4 is a diagram showing the sequence of writing the bits forming a frame at the time of interleaving into the various storage areas of operating memory, and the sequence of reading the bits forming a frame at the time of de-interleaving from the various storage areas of operating memory in said embodiment.
Figure 5:
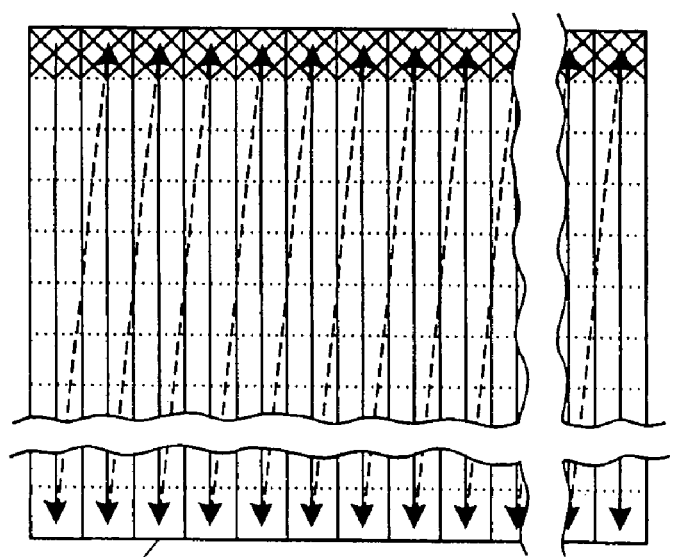
FIG. 5 is a diagram showing the sequence of reading the bits forming a frame at the time of interleaving from the various storage areas of operating memory, and the sequence of writing the bits forming a frame at the time of de-interleaving into the various storage areas of operating memory in said embodiment.

Following is a description of interleaving implemented by this interleaving device 1, with reference to FIG. 4 and FIG. 5.

In the present embodiment, interleaving is implemented by using (m+1)×p continuous storage areas in the operating memory 220.

FIG. 4 and FIG. 5 show the storage area of the operating memory 220 for interleaving expressed as a two-dimensional memory space. The various individual addresses correspond to the storage areas in this memory space. An address is formed from a lower address which can take p combinations of values, and an upper address which can take (m+1) combinations of values.

In FIG. 4 and FIG. 5, the storage areas which are to have identical upper addresses are arranged from left to right in lower address order, and the storage areas which are to have identical lower addresses are arranged from top to bottom in upper address order. As stated above, a series of storage areas with identical upper addresses shall be called rows, and a series of storage areas with identical lower addresses shall be called columns.

In implementing interleaving, first of all, the bit sequences that are to be interleaved are written sequentially, each in their respective m×n storage areas, one bit at a time. When this writing is executed, the writing addresses are generated by the writing address supply part 210 described above with reference to FIG. 2.

While the p bits forming the header H are being supplied to the operating memory 220 synchronously with the bit clock CLK, the bit clock CLK counting is carried out according to the p-scale counter 210A in the writing address supply part 210. The writing address WADh is generated, containing the count value of the p-scale counter 210A as a lower address, and "0" as an upper address, and it is supplied to the operating memory 220 synchronously with the bit clock CLK.

Consequently, as shown in FIG. 4, the p bits forming the header H are written into the initial row within the storage area of the operating memory 220 for interleaving.

Next, following the header H, the m×p bits forming the data D are supplied to the operating memory 220 synchronously with the bit clock CLK.

In the meantime, the counting of the bit clock CLK is carried out by the m-scale counter 210C in the writing address supply part 210, and in addition, a count value increment of the p-scale counter 210B is executed each time the m-scale counter 210C yields a count-over. Moreover, a writing address WADd is generated that contains a lower address which is the count value of the p-scale counter 210B and a upper address which is obtained by adding the count value of the m-scale counter 210C with one, and this writing address is supplied to the operating memory 220 synchronously with the bit clock CLK.

Consequently, as shown in FIG. 4, the initial m bits from among the m×p bits forming the data D are written into each storage area corresponding to the (m+1)th row, from the second row of the first column, and into the operating memory 220, and then the m bits are written into each storage area corresponding to the (m+1)th row, from the second row of the second column, and so forth, until the final m bits (i.e., the pth bit) are written into each storage area corresponding to the (m+1)th row, from the second column of the pth column.

Next, the bits that are thusly written into the operating memory 220 are read in a sequence that differs from when they were written.

In this reading operation, reading addresses are generated by the reading address supply part 230 described with reference to FIG. 3.

That is to say, the counting of the bit clock CLK is carried out by the (m+1)-scale counter 230B, and in addition, a count value increment with a count value of "1" only of the p-scale counter 230A is executed each time the (m+1)-scale counter 230B yields a count-over. Moreover, a reading address that contains the count value of the p-scale counter 230A as a lower address, and the count value of the (m+1)-scale counter 230B as an upper address, and this is supplied to the operating memory 220 synchronously with the bit clock CLK.

Consequently, as shown in FIG. 5, first of all, the (m+1) bits recorded in each storage area of the first column in the operating memory 220 are read, and then the (m+1) bits recorded in each storage area of the second column are read, and so forth, until finally, the (m+1) bits recorded in each storage area of the pth column are read.

Due to the above-described interleaving, frames are produced such that the p bits forming the header H are scattered and arranged at equal intervals within the bit sequence forming the data D. It should be noted that the state of the frames after interleaving is described in detail below with reference to the drawings.

(2) The De-Interleaving Device

Figure 6:
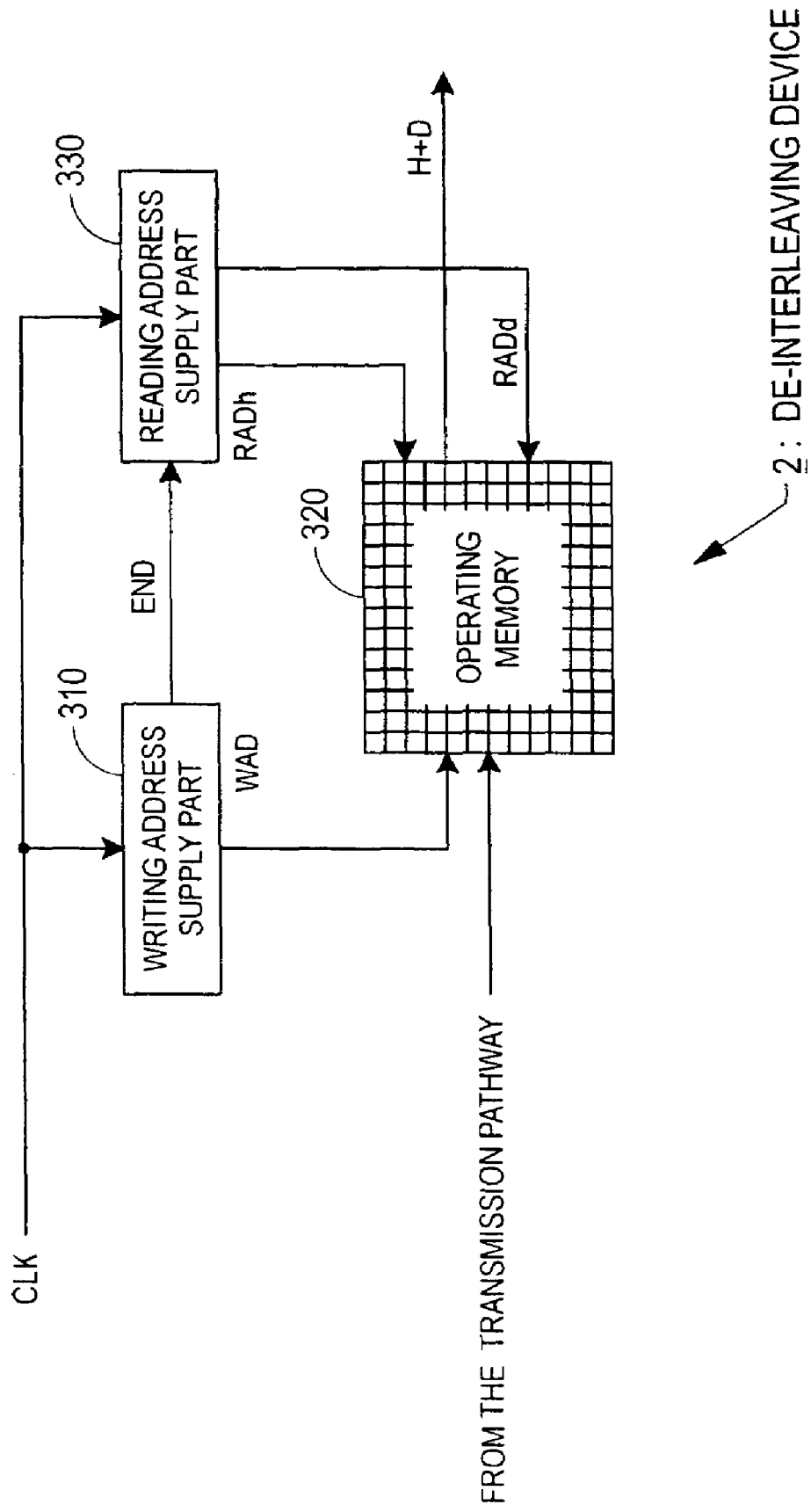
FIG. 6 is a block diagram showing a configuration of a de-interleaving device relating to said embodiment.

The frames that are interleaved in the transmission side device are transmitted to the receiving side device. FIG. 6 is a block diagram showing a configuration of the de-interleaving device 2 provided to said receiving side device.

This de-interleaving device 2 comprises a writing address supply part 310, an operating memory 320, and a reading address supply part 330.

Here, the operating memory 320 is a storage device similar to the operating memory 220 in the interleaving device 1. The (m+1)×p bits forming the frames received via the transmission pathway are supplied to the operating memory 320 synchronously with the bit clock CLK.

De-interleaving consists of the process of writing these bits to the operating memory 320, and the process of reading these bits from the operating memory 320 in a sequence that differs from when they were written.

While the bits forming the received frame are being supplied to the operating memory 320 synchronously with the bit block CLK, the writing address supply part 310 supplies the writing address WAD to the operating memory 320 synchronously with the bit clock CLK.

This writing address supply part 310 possesses a configuration identical to that of the reading address supply part 230 in the interleaving device 1 (see FIG. 3).

Moreover, in the case of this writing address supply part 310, the counting of the bit clock is carried out by the (m+1)-scale counter, and in addition, a count value increment with a count value of "1" only if the p-scale counter is executed each time the (m+1)-scale counter yields a count-over. Moreover, a writing address WAD that contains the count value of the p-scale counter as a lower address, and the count value of the (m+1)-scale counter as an upper address is supplied to the operating memory 320 synchronously with the bit clock.

Consequently, as shown in FIG. 5, the initial (m+1) bits from among the (m+1)×p bits forming the received frame are written to each storage area of the first column in the operating memory 320, and then the (m+1) bits are written into each storage area of the second column, and so forth, until the final (m+1) bits (i.e., the pth bit) are written into each storage area of the pth column.

The placement of each bit in the operating memory 320 at this time is in agreement with the position of these bits when they are written to the operating memory 220 of the interleaving device 1 prior to being transmitted from the transmission side device.

When the process of writing all of the bits forming the received frame to the operating memory 320 is completed, the END signal indicating this is supplied to the reading address supply part 330 from the writing address supply part 310.

This reading address supply part 330 possesses a configuration identical to that of the writing address supply part 210 in the interleaving device 1 (see FIG. 2).

Moreover, in the case of this reading address supply part 330, the counting of the bit clock CLK is carried out by the p-scale counter. Moreover, a reading address RADh that contains the count value of the p-scale counter as a lower address, and "0" as an upper address is generated, and supplied to the operating memory 320 synchronously with the bit clock.

Consequently, as shown in FIG. 4, the p bits forming the header H are read from each storage area corresponding to the initial row in the operating memory 310.

Next, in the case of the reading address supply part 330, the counting of the bit clock CLK is carried out by the m-scale counter, and in addition, a count value increment with a count value of the p-scale counter is executed each time the m-scale counter yields a count-over. Moreover, a reading address RADd that contains a lower address which is the count value of the p-scale counter, and an upper address which is obtained by adding the count value of the m-scale counter with "1" is generated and supplied to the operating memory 320 synchronously with the bit clock CLK.

Consequently, as shown in FIG. 4, the initial m bits from among the m×p bits forming the data D are read from each storage area corresponding to the (m+1)th row from the second row of the first column in the operating memory 320. Then, the following m bits are read from each storage area corresponding to the (m+1)th row from the second row of the second column in the operating memory 320, and the following m bits are read from each storage area corresponding to the (m+1)th row from the second row of the third column, and so forth, until the final m bits (i.e., the pth bit) are read from each storage area corresponding to the (m+1)th row from the second row of the pth column.

Accordingly, the de-interleaving device 2 performs an operation that is completely the reverse of the interleaving performed in the case of the interleaving device 1, and restores the original un-interleaved frame.

(3) Advantageous Effects of the Present Embodiment

Following is a description of the advantageous effects of the present embodiment, with reference to FIGS. 7A-7D.

Figure 7:
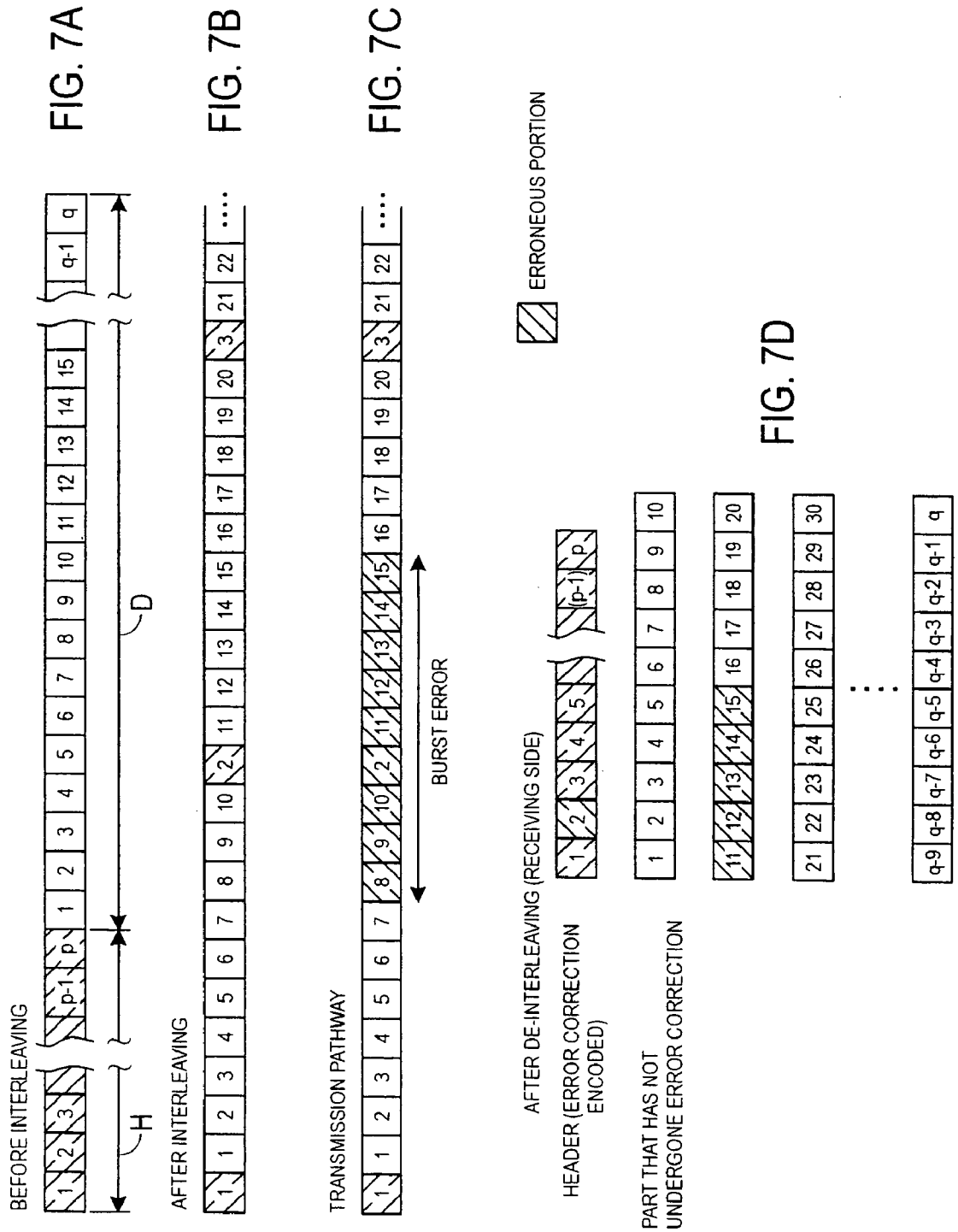
FIGS. 7A-7D are time charts showing the operation of said embodiment.

First, FIG. 7A shows the configuration of a frame that is interleaved in the transmission side device. As this figure shows, the frame to be interleaved is formed from the header H that has undergone error correction encoding by means of an error correction code, and the data D which has not undergone error correction encoding.

In this example, the header H consists of k1 code words, and the code length of each code word is m1 bits. Also, the header H is a bit sequence consisting of p(=k1×m1) bits.

The data D which has not undergone error correction encoding is a bit sequence consisting of q (=m×p) bits.

When this frame is interleaved by means of the interleaving device 1 shown in FIG. 1, a frame is produced which has the bits arranged as shown in FIG. 7B. That is to say, due to interleaving, the p bits forming the header H are scattered and arranged at equal intervals within the bit sequence forming the data D. Here, the interval after interleaving the p bits forming the header H is a bit length corresponding to the degree of change in the upper address of the writing address when the each bit of the data D is written, after the lower address of the writing address is changed in the interleaving device 1, while writing each bit of the header H into the operating memory 220, in other words, the m bit. It should be noted here that when m=10 in FIG. 7B, the configuration is that of a frame after interleaving.

Now let us consider the case where a burst error as the one shown in FIG. 7C is generated in the process of transmitting a frame after the interleaving shown in FIG. 7B. In the example shown in FIG. 7C, the second bit in the bit sequence forming the header H and the $8^{th}$ to $15^{th}$ bits in the bit sequence forming the data D are compromised by the burst error.

When de-interleaving by means of the de-interleaving device 2 shown in FIG. 6 is performed on a frame in which such burst errors have occurred, the frames are recovered as shown in FIG. 7D.

As shown in. FIG. 7D, as regards the header H in the recovered frame, only the second bit is affected by the burst error. In an embodiment such as this one, the header H is not readily affected by a burst error, even if said burst error occurs in a frame in the process of transmission. Even if it were affected, the result would be nothing more than a random error in the header H after de-interleaving. In other words, the interleaving performed in the present embodiment brings about the advantageous effect of randomization of burst errors with respect to the header H.

Here, if the number of erroneous bits in the header H is within the error correcting capacity of the error-correcting code, then the signal error can be corrected in the receiving side device.

By contrast, as regards the data D in the recovered frame, the continuous bits from the $8^{th}$ to the $15^{th}$ bits are affected by the burst error. Thus, in the present embodiment, when a burst error occurs in a frame in the process of transmission, the burst error appears in the data D unchanged after de-interleaving. That is to say, in the present embodiment, interleaving does not bring about the effect of randomization of burst errors with respect to the data D.

It is acceptable for the data D not to have undergone error correction encoding in cases where the said concealment or the like have been implemented, since the signal errors are concentrated together.

As described above, in accordance with the present embodiment, even if a burst error occurs in the process of transmission of data D such as voice or image to which has been added the header H that has undergone error correction encoding, the signal error is randomized only with respect to the header H, and the data D that has not undergone error correction encoding is not randomized, so advantageous effects are realized in that errors relating to the header H are readily corrected on the receiving side, and in that it becomes easy to implement concealment and the like on the receiving side.

(4) Variations on the Present Embodiment

Following are variations on the present embodiment which was described above.

① In the interleaving device and the de-interleaving device, the writing address and the reading address with respect to the operating memory can be generated by having the processor execute specified software, and dedicated software can be used for this purpose.

② The address-generating algorithm for interleaving is not limited to that of the above-described embodiment. It can, for example, be the reverse of that of the above-described embodiment in connection with the upper addresses and lower addresses, or in connection with the rows and columns in the operating memory. Another example is that the header and the data can be temporarily stored in separate areas within the operating memory, and interleaving can be performed in connection with the present invention according to a simple method involving the alternating repetition of single-bit reading of the bits forming the header and m-bit reading of the bits forming the data.

③ In the above-described present embodiment, all bits of the header H are written to the storage area in the space of one row in the operating memory. 220 at the time of interleaving, but it is also possible to write into the storage space of a plurality of rows.

④ The interleaved and de-interleaved frames can have different lengths for each frame.

⑤ In the above-described present embodiment, the bits forming the header are scattered and arranged within data possessing a bit length that is greater by a factor of several integers-fold, but the ratio of the header length and data length does not need to be in terms of integers. In cases where the ratio of the header length and the data length cannot be expressed in integers, it is possible to employ a method such as performing interleaving by adding a dummy bit to the data, with the length of the header being expressed in terms of integers, and then removing the dummy bit. Also, the bits forming the header do not necessarily have to be scattered and arranged within the data at equal intervals. If one already knows on the receiving side the method whereby the bits forming the header will be scattered and arranged, it is possible to perform de-interleaving on the receiving side, even if the scattering and arranging is done at non-uniform intervals.

B. Second Embodiment

Figure 8:
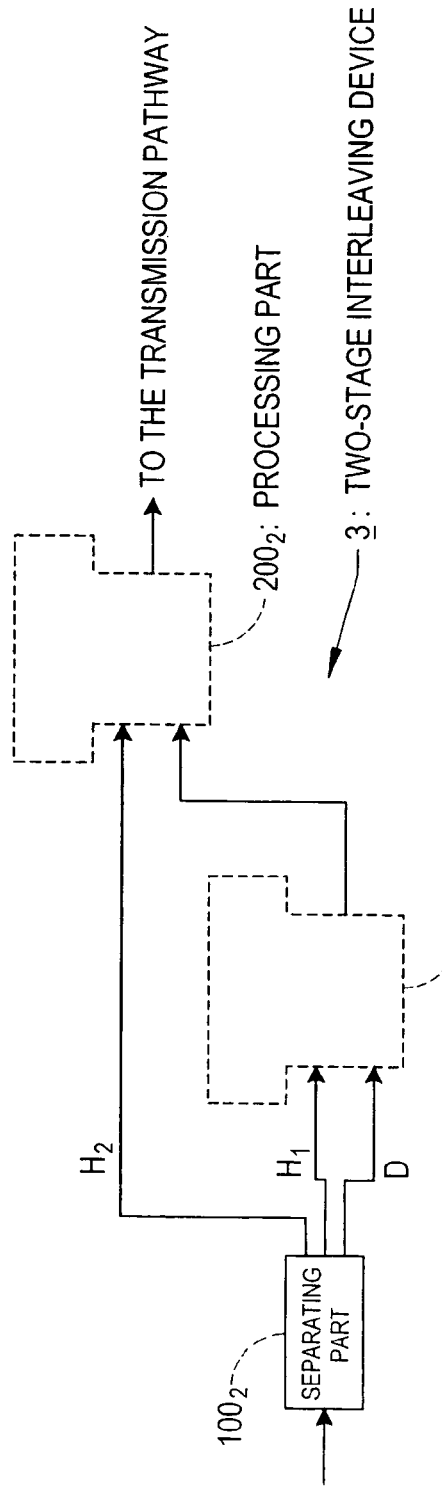
FIG. 8 is a block diagram showing a configuration of a two-stage interleaving device relating to the second embodiment of this invention.
Figure 9:
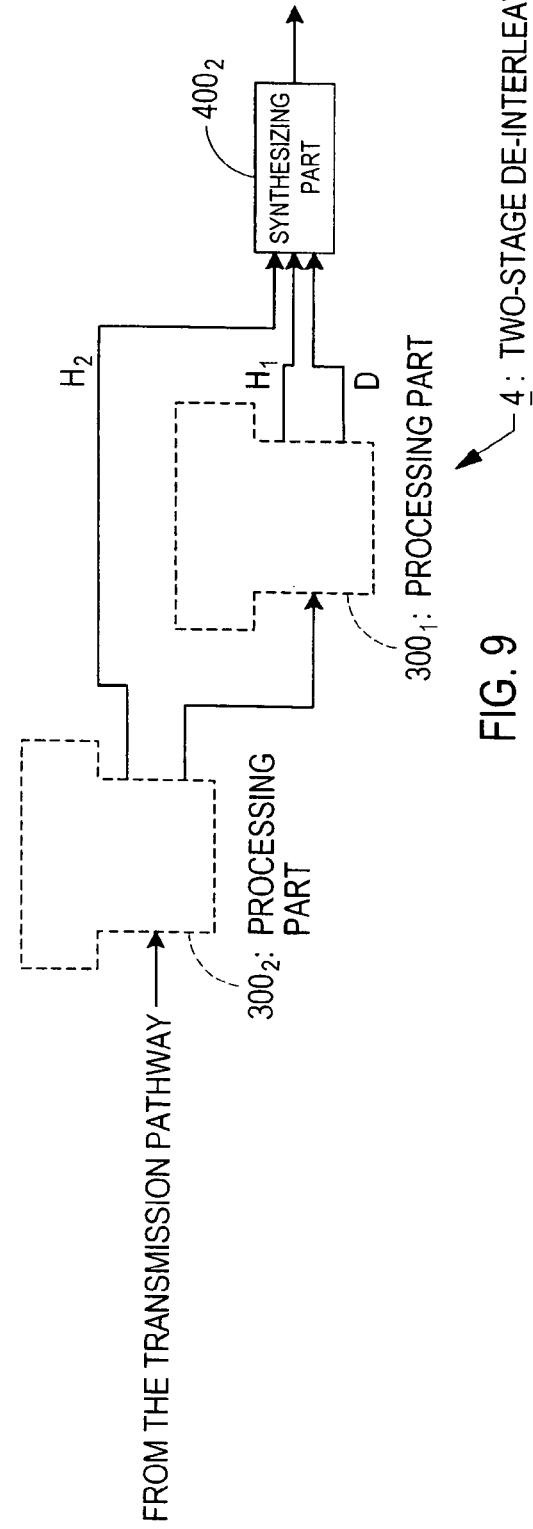
FIG. 9 is a block diagram showing a configuration of a two-stage de-interleaving device relating to said embodiment.
Figure 12:
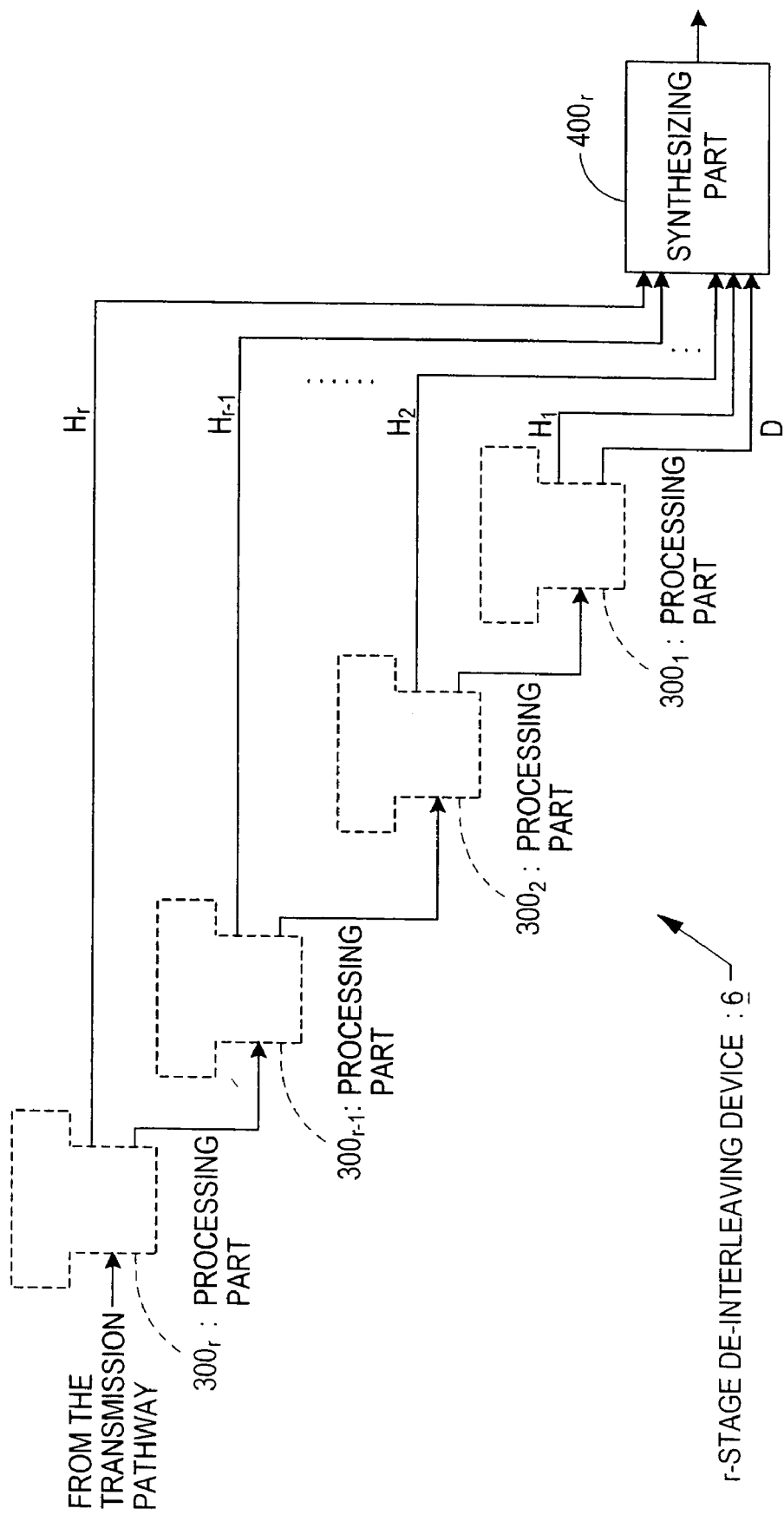
FIG. 12. Is a block diagram showing a general configuration of a multi-stage de-interleaving device relating to said embodiment.

FIG. 8 is a block diagram showing a configuration of the two-stage interleaving device 3 serving as an example of a multi-stage interleaving device relating to the present embodiment. FIG. 9 is a block diagram showing the configuration of a two-stage de-interleaving device 4 serving as an example of a multi-stage de-interleaving device relating the present embodiment. FIGS. 10A-10F are diagrams showing the operation of the present embodiment. FIG. 11 is a block diagram showing a configuration of an r-stage interleaving device 5 serving as a generalized example of the present embodiment. Moreover, FIG. 12 is a block diagram showing the configuration of the r-stage de-interleaving device serving as a generalized example of the present embodiment. As already discussed in the first embodiment, interleaving devices are provided in transmission devices of digital telecommunications systems, and de-interleaving devices are provided in the equipment on the receiving side. The present embodiment is described below with sequential reference to FIG. 8 to FIG. 12.

(1) Two-Stage Interleaving Device

First a two-stage interleaving device 3 relating to the present invention is described with reference to FIG. 8.

This two-stage interleaving device 3 consists of a separating part $100_2$, a processing part $200_1$, and a processing part $200_2$.

The configuration of the frame that is to be processed by the two-stage interleaving device 3 is shown in FIG. 10A.

In the above-described first embodiment, the header H of the frame to be interleaved was configured by a code word that had undergone error correction encoding by only one type of error-correcting code.

A frame that is to be interleaved in the present embodiment is formed from the header H that has undergone error correction encoding in the same manner as in the first embodiment, and the data D that has not undergone error correction encoding, but the header H consists of the header $H_1$ and the header $H_2$. Here, the header $H_1$ and the header $H_2$ have undergone error correction encoding according to different types of error-correcting codes. It should be noted that for the sake of convenience in the description, hereinafter, the bit length of the data D is to be 63 bits, the bit length of the header $H_1$ is to be 9 bits, and the bit length of the header $H_2$ is to be 3 bits.

The separating part $100_2$ is similar to the separating part $100_1$ relating to the first embodiment in the sense that it divides the bit sequence forming the frame into the header H that has undergone error correction encoding, and the data D that has not undergone error correction encoding. However, the separating part $100_2$ relating to the present embodiment performs the additional function of further separating the header H that was separated from the data D, separating it into the header $H_1$ that has undergone error correction encoding by a primary error-correcting code, and the header $H_2$ that has undergone error correction encoding by a secondary error-correcting code.

FIG. 10B shows the header $H_2$ and the header $H_1$ and the data D resulting from separation by the separating part $100_2$. In addition, the separating part $100_2$ supplies the data D and the header $H_1$ to the processing part $200_1$, and supplies the header $H_2$ to the processing part $200_2$. The processing results of the processing part $200_1$ are also delivered to the processing part $200_2$, along with the header $H_2$.

The processing part $200_1$ and the processing part $200_2$ both possess almost the same configuration as the processing part 200 of the first embodiment.

Moreover, the processing part $200_1$ performs interleaving, which scatters and arranges the 9 bits that make up the header $H_1$ in the bit sequence of the data D. The configuration and operation for performing interleaving have already been described in the first embodiment, with reference to FIG. 1 to FIG. 5.

FIG. 10C shows a bit sequence output by the processing part $200_1$ in the process of interleaving.

As shown in FIG. 10C, the 9 bits making up the header $H_1$ are scattered and arranged at equal intervals in the but sequence making up the data D, said bit sequence consisting of 72 (=8×9) bits output by the processing part $200_1$. Here, 7 (=63/9) continuous bits in the data D are inserted between the bits making up the header $H_1$. The bit sequence of the data D inserted between the bits of the header is 7 bits.

Next, the processing part $200_2$ executes interleaving, thereby scattering and arranging the 3 bits making up the header $H_2$ at equal intervals within the 72-bit bit sequence output by the processing part $200_1$. The details of the processing involved in the interleaving performed by this processing part $200_2$ is identical to that of the interleaving performed by the processing part $200_1$.

FIG. 10D shows a bit sequence as it passes through the process of interleaving performed by the processing part $200_2$.

As shown in FIG. 10D, in the bit sequence after interleaving, 24 (=72/3) continuous bits in the bit sequence output by the processing part $200_1$ are inserted among the 3 bits forming the header $H_2$.

The bit sequence produced by the processing part $200_2$ is sent to the receiving side device via the transmission pathway as a frame that has undergone two-stage interleaving.

(2) Two-Stage De-Interleaving Device

Following is a description of the two-stage de-interleaving device 4 provided to the receiving side device.

As shown in FIG. 9, the two-stage de-interleaving device 4 consists of a processing part $300_2$, a processing part $300_1$, and a synthesizing part $400_2$.

The processing parts $300_1$ and $300_2$ both possess a configuration similar to the de-interleaving device 2 in the first embodiment (see FIG. 6).

The processing part $300_2$ performs de-interleaving on the frames received from the transmission pathway, by an operation that is the complete reverse of the interleaving performed by the processing part $200_2$.

For example, in the case where a frame with the content shown in FIG. 10D is delivered to the processing part $300_2$, the bit sequence shown in FIG. 10C is obtained by the de-interleaving performed by the processing part $300_2$.

This bit sequence consists of the bit sequence of 3 bits forming the header $H_2$, and the bit sequence with the bits forming the header $H_1$ scattered and arranged in the bit sequence of the data D.

Of these, the header $H_2$ is supplied to the synthesizing part $400_2$. On the other hand, the bit sequence of bits forming the header $H_1$ scattered and arranged in the bit sequence of the data D is supplied to the processing part $300_1$.

The processing part $300_1$ performs de-interleaving, which is the completely reverse operation from the interleaving performed by the processing part $200_1$. Due to this de-interleaving, the data D, formed from the header $H_1$ consisting of 7 bits plus the 63 bits shown in FIG. 10B, is recovered from the bit sequence of the bits forming the header $H_1$ scattered and arranged in the bit sequence of the data D.

The synthesizing part $400_2$ synthesizes the header $H_2$ and the header $H_1$ with the data D, outputting the original frame shown in FIG. 10A.

The above is a detailed description of the two-stage de-interleaving device 4 shown in FIG. 9.

(3) Advantageous Effects of the Present Embodiment

Following is a description of the advantageous effects of the present embodiment, with reference to FIGS. 10A-10F.

First, let us suppose that the burst error shown in FIG. 10E is generated in the process of transmission of the interleaved frame shown in FIG. 10D. In the example shown in FIG. 10D, 1 bit in the bit sequence forming the header $H_1$, 1 bit in the bit sequence forming the header $H_2$, and several continuous bits forming the data D are compromised by the burst error.

When the frame that has been affected by such a burst error is received by the receiving side device, and then de-interleaved by the two-stage de-interleaving device 4, the frame is recovered in the state shown in FIG. 10F.

In the recovered frame, the effect of the burst error is manifested in the header $H_1$ that has undergone error correction encoding by the primary error-correcting code and in the header $H_2$ that has undergone error correction encoding by the secondary error-correcting code, resulting in a random signal error of 1 bit each, and the effect of the burst error is manifested in the data D that has not undergone error correction encoding, resulting in a signal error of several continuous bits. That is to say, in the present embodiment, the advantageous effect of randomization by interleaving affects only the header $H_1$ and the header $H_2$, but the advantageous effect of randomization due to interleaving does not affect the data D.

Here, if the number of erroneous bits in the headers $H_1$ and $H_2$ is within the error correcting capacity of the error-correcting codes, the erroneous bits can be corrected. Furthermore, the aforementioned concealment is implemented since burst errors occur in the data D that has not undergone error correction encoding.

As described above, in accordance with the present embodiment, and as in the above-described first embodiment, errors are randomized only with respect to the headers $H_1$ and $H_2$, even if burst errors are generated in the process of transmitting the added headers $H_1$ and $H_2$ that have undergone error correction encoding by two different error-correcting codes to data D such as voice and images, but errors are not randomized with respect to the data D. Therefore, error correction for the headers is readily accomplished on the receiving side, and there is also the advantageous effect that concealment and the like is readily implemented on the receiving side with respect to the data D. Furthermore, since interleaving is executed twice by scattering and arranging the bits in the header $H_1$ and $H_2$ in the present embodiment, it is possible to achieve the advantageous effect of maximum randomization for each header, by performing interleaving under the optimal conditions for each head.

(4) General Configuration of a Multi-Stage Interleaving Device and a Multi-Stage De-Interleaving Device The above describes the case where the header that has undergone error correction encoding consists of two components, namely, the header $H_1$ that has undergone error correction encoding by the primary error-correcting code, and the header $H_2$ that has undergone error correction encoding by the secondary error-correcting code, but the present embodiment is not limited to this case, and can, of course, be applied also to the case where the frame possesses 3 or more headers that have undergone error correction encoding by different error-correcting codes.

FIG. 11 shows the configuration of the r-stage interleaving device 5 which interleaves frames that contain r number of headers that have undergone error correction encoding by different error-correcting codes.

As shown in the figure, the r-stage interleaving device 5 consists of the separating part $100_r$, and the r number of processing parts $200_1$-$200_r$.

The separating part $100_r$ divides the frame into the r number of headers $H_1$-$H_r$ and the data D.

The processing part $200_1$ executes interleaving which scatters and arranges the bits forming the header $H_1$ at equal intervals in the bit sequence forming the data D, and outputs the resulting bit sequence.

The processing part $200_2$ executes interleaving which scatters and arranges the bits forming the header $H_2$ at equal intervals in the bit sequence output by the processing part $200_1$.

The same applies to the other processing parts as well. That is to say, the various processing parts $200_k$ (where k=1 to r) in FIG. 11 execute interleaving which scatters and arranges the bits forming the headers $H_k$ at equal intervals in the bits output by the processing part $200_{k-1}$.

Then, the bit sequence obtained from the final stage (the rth stage) processing part $200_r$ is transmitted to the receiving side device via the transmission pathway as an interleaved frame.

De-interleaving of the received frame is performed in the receiving side device, by means of an r-stage de-interleaving device 6 shown in FIG. 12.

This r-stage de-interleaving device 6 possesses an r number of processing parts $300_k$ (where k=1 to r) and the synthesizing part $400_r$.

The processing parts $300_k$ (where k=1 to r) execute de-interleaving, which is completely the reverse operation from the interleaving performed by the processing parts $200_k$ (where k=1 to r).

In further detail, the processing parts $300_k$ perform de-interleaving, which is the reverse of the interleaving performed by the processing parts $200_k$, on the frames received in the process of transmission, and it also outputs the header $H_r$ formed from continuous bits, and a bit sequence with the bits forming other headers scattered and arranged within the data D. In addition, the processing parts $300_k$ deliver the headers $H_r$ to the synthesizing part $400_r$, and deliver the latter bit sequence to the processing part $300_{r-1}$. Next, the processing part $300_{r-1}$ performs de-interleaving on the bit sequence output by the processing part $300_r$, the reverse of the interleaving performed by the processing part $200_{k-1}$, and outputs the header $H_{r-1}$ formed from continuous bits, and a bit sequence with the bits forming other headers scattered and arranged within the data D. Furthermore, the processing part $300_{r-1}$ delivers the header $H_{r-1}$ to the synthesizing part $400_r$ and delivers the latter bit sequence to the processing part $300_{r-2}$. The various processing parts $300_k$ following this processing part $300_{r-2}$ also perform the same operation. Then, the processing part $300_1$ of the final stage performs de-interleaving, which is the reverse of the interleaving performed by the processing part $200_1$, with respect to the bit sequence output by the processing part $300_2$, and delivers both the header $H_1$ and the data D to the synthesizing part $400_r$.

The synthesizing part $400_r$ synthesizes the headers $H_1$ -$H_r$ output by the various processing parts and the data D, thereby recovering the original frame.

It is clear from the above description that the present invention can be applied not only to the case where a frame has two types of headers, but also to the case where a frame has 3 or more types of headers.

C. Third Embodiment

In the first and second embodiments, the frame to be transmitted is separated into the part that has undergone error correction encoding and the part that has not undergone error correction encoding, and interleaving is performed by scattering and arranging the bits making up the former across the entire range of the bit sequence of the latter.

Embodiments of interleaving in the present invention are not limited to the above.

For example, there is the case where data that has not undergone error correction encoding contain types of data strings that, because of their nature, should undergo the randomization effect of interleaving.

The present embodiment assumes this type of case. In the present embodiment, the data that has not undergone error correction encoding is divided into a part for which the randomization effect of interleaving is desirable, and a part for which it is not desirable, and interleaving is performed by scattering and arranging the bits that make up the former part in the bit sequence of the latter part.

Figure 13:
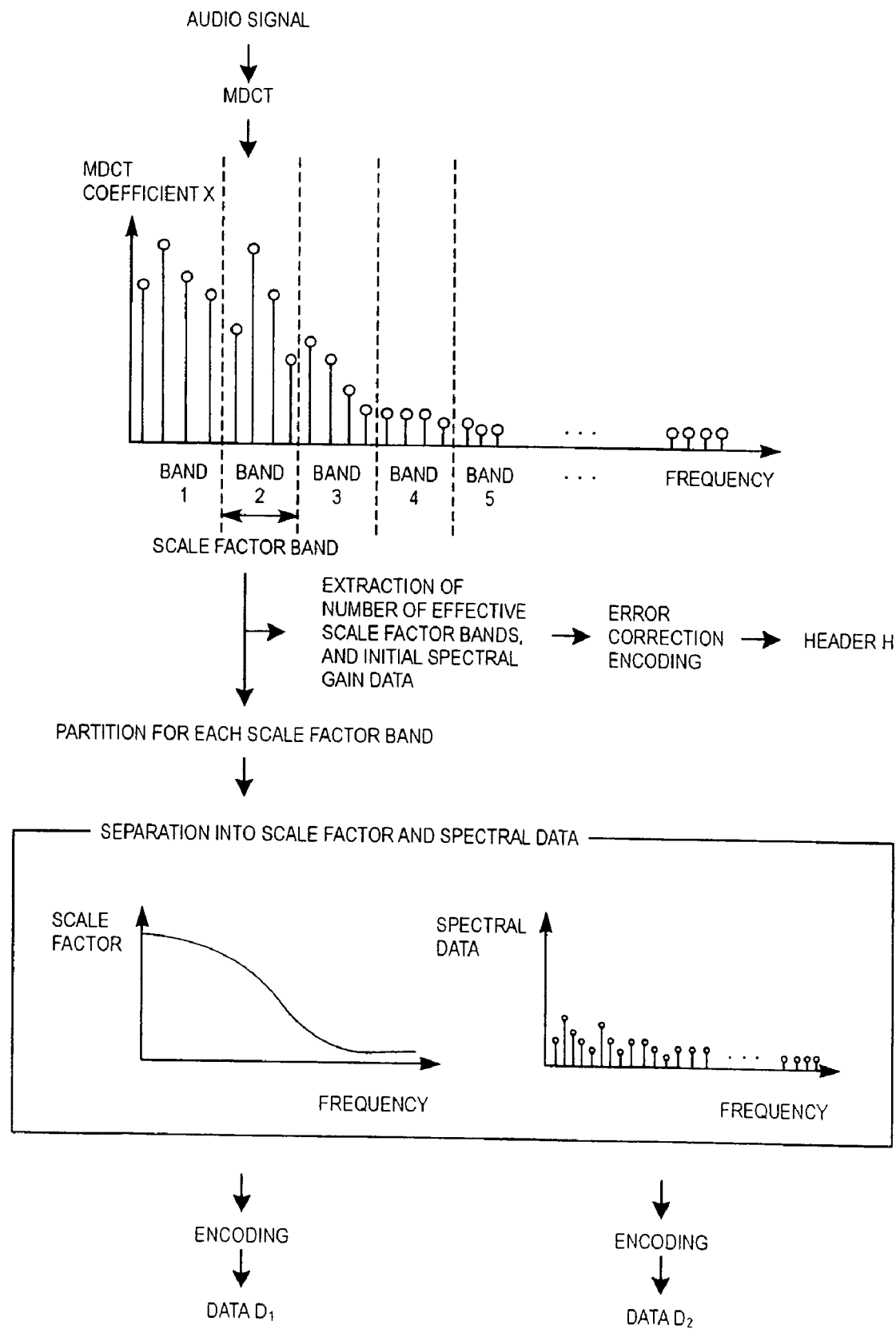
FIG. 13 is a diagram describing the process of generating compressed signal data of audio signals used by the third embodiment of this invention.

Compressed signal data of audio signals are suitable objects for application of the present embodiment. Before describing the process of interleaving in the present embodiment, there follows an explanation of the method for generating such encoded data, making reference to FIG. 13.

First, a Modified Discrete Cosine Transformation (MDCT), a type of time-frequency transformation, is performed on a single-frame audio signal sample (1,024 samples in this example), thereby converting the audio signal to parameters on the frequency axis known as MDCT coefficients.

Next, the MDCT coefficients are divided into previously-determined frequency band (scale factor band) units. Since the frequency resolution is typically narrower than the band width of this scale factor band, a plurality of MDCT coefficients will be present in each scale factor band.

Next, for each of the scale factor bands, the scale factor SF and the spectral data ML are derived from the plurality of MDCT coefficients X. Here, the scale factor SF corresponds to an indicator when the MDCT coefficient is discript as a floating point, and the spectral data ML corresponds to a parameter.

A plurality of MDCT coefficients belong to each scale factor band, but the scale factor SF is generated one at a time for each scale factor band. On the other hand, the spectral data ML are generated in response to the various MDCT coefficients X belonging to said scale factor bands.

The relationship among the above-described MDCT coefficient X, the scale factor SF, and the spectral data ML is given by the following formula:

$$Abs(X) = int((abs(ML)*(2^{(1/4*(SF-OFFSET))}))^{(4/3)} + \text{MAGIC NUMBER}) \quad (1)$$

However, in the formula above, the function abs(X) represents the absolute value of the variable X. Also, OFFSET and MAGIC NUMBER are constants, e.g., OFFSET=100 and MAGIC NUMBER=0.4054.

According to Formula (1), multiple combinations of the scale factor SF and the spectral data ML can be obtained with respect to one MDCT coefficient X. Thus, there is some freedom in the selection of the scale factor SF. Accordingly, the scale factor SF is selected so as to reduce to a minimum the amount of data of the spectral data ML corresponding to each MDCT coefficient belonging to the scale factor band in question. This scale factor SF is obtained by iteration, through repeated calculations of Formula (1).

Next, differential encoding of each scale factor SF corresponding to each scale factor band is carried out.

First, in the case where the scale factor band is, for example, from band 1 to band n, the differential between the scale factor SF of band 1 and the scale factor SF of band 2, the differential between the scale factor SF of band 2 and the scale factor SF of band 3, are determined, and so forth, until the differential of the scale factor of band n−1 and the scale factor SF of band n is determined.

Next, the resulting differentials are encoded using a Reversible Variable Length Code (RVLC). This RVLC is a reversible variable length code from the front as well as from the back.

An example of this RVLC is a variable length code containing a fixed number of "1". For example, if the number of "1"s is determined in advance to be "3" then it is possible to generate a series of RVLC such as "111", "1011", "1101", "11001", and "10101".

In another example, variable length codes containing an equal number of "0" and "1" can form a RVLC (e.g., "01", "10", "0011", "1100", "001011", "000111", "110100", etc.). There is also the example of RVLC where the code is completely symmetrical right/left (e.g., "0", "101", "111", "1001", "11011", "10001", etc.).

Regarding the spectral data ML, Huffman encoding is performed, and Huffman code scrambling is executed. When this Huffman code scrambling is executed, it is possible to prevent errors from propagating at the time of decoding.

Next, using the resulting data, a frame is assembled consisting of the header H, the data $D_1$ corresponding to the scale factor SF, and the data $D_2$ corresponding to the spectral data ML.

In this frame, the header H includes a code word that has been obtained by carrying out error correction encoding on important information such as effective scale factor bands and various scale factors SF in band 1 and n. Here, the various scale factors SF in band 1 and n are utilized as the initial scale gain data when undertaking consecutive decoding of the scale factor SF of each band in the receiving side device. The reason why this initial scale gain data and error-correcting encoding for the number of scale factor bands are included in the header H is that if it is impossible to correctly decode these data in the receiving side device, then decoding of all scale factors SF belonging to the frame becomes impossible.

The data $D_1$ contains RVLCs encoded with the differentials between the scale factors SF of the various bands. The data $D_2$ contains data for which the spectral data ML has undergone Huffman encoding as well as Huffman code scrambling. It should be noted that the data $D_1$ and $D_2$ have not undergone error correction encoding.

To sum up the above points, frames that are suitable for use in the present embodiment are as follows:
a. Error correction encoded header H Initial scale gain data (various scale factors SF in band 1 and n) Effective number of scale factor bands
b. Error correction unencoded data $D_1$ RVLC encoded with differentials between the scale factors SF of the various bands
c. Error correction unencoded data $D_2$ Data with Huffman encoded spectral data ML and that has undergone Huffman code scrambling The number of bits of the header H, and the data $D_1$ and $D_2$ varies from frame to frame, but, under conditions such as a sampling rate of 40 kbps/48 kHz, for example, the number of bits will be on the order of 320 bits, 80 bits, and 1,200 bits, the order shown in FIG. 14A.

The above is a detailed description of the object to be transmitted in the present embodiment.

Figure 15:
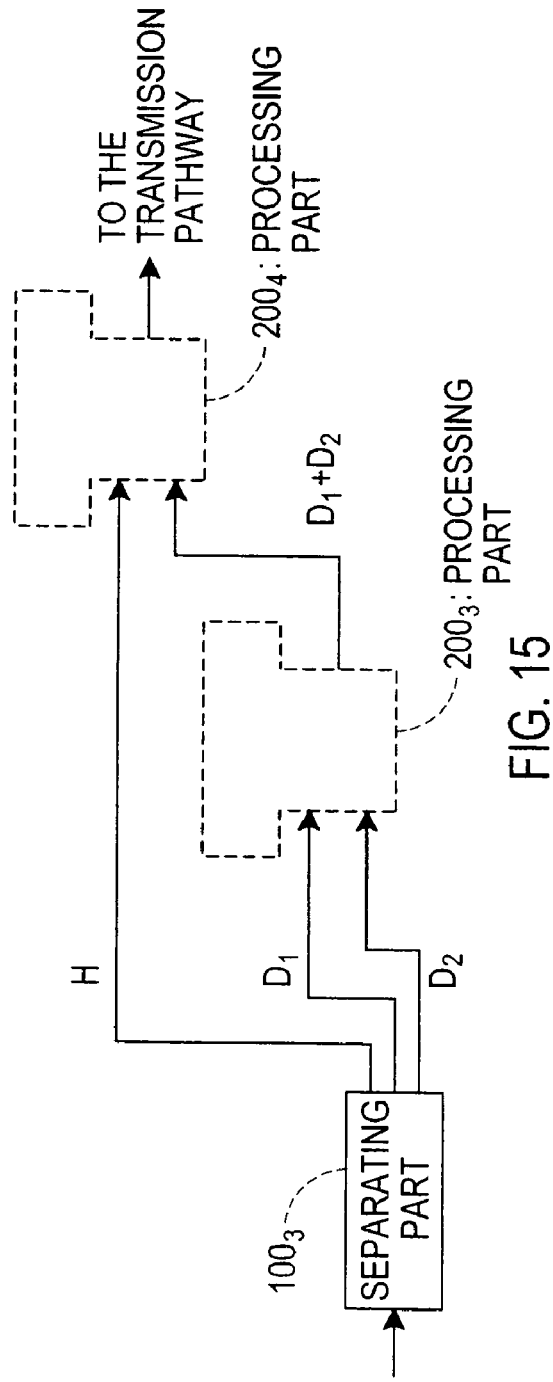
FIG. 15 is a block diagram showing a configuration of an interleaving device relating to said embodiment.

FIG. 15 is a block diagram showing the configuration of an interleaving device relating to the present embodiment where interleaving is performed on such an object.

As shown in the figure, the interleaving device relating to the present embodiment consists of a separating part $100_3$, plus the two processing parts $200_3$ and $200_4$.

Of these, the separating part $100_3$ is similar to the separating part $100_1$ of the first embodiment, in the sense that one frame is divided into the header H that has undergone error correction encoding, and data which has not undergone error correction encoding. However, the separating part $100_3$ relating to the present embodiment separates the data that has not undergone error correction encoding further into the data $D_1$ corresponding to the scale factor SF, and the data $D_2$ corresponding to the spectral data ML. In addition, the separator part $100_3$ delivers the header H to the processing part $200_4$, and the data $D_1$ and $D_2$ to the processing part $200_3$.

The configurations of the processing parts $200_3$ and $200_4$ are almost identical to that of the processing part 200 of the first embodiment.

Moreover, the processing part $200_3$ performs interleaving by scattering and arranging the bits forming the data $D_1$ in the bit sequence of the data $D_2$, so that the resulting bit sequence is output.

The processing part $200_4$ performs interleaving by scattering and arranging the bits forming the header H at equal intervals across the entire range of the bit sequence output by the processing part $200_3$, and after this interleaving, the frame is delivered to the receiving side device via the transmission pathway.

Next, a specific example of the operation of an interleaving device relating to the present embodiment is explained with reference to FIGS. 14A-14E.

Figure 14:
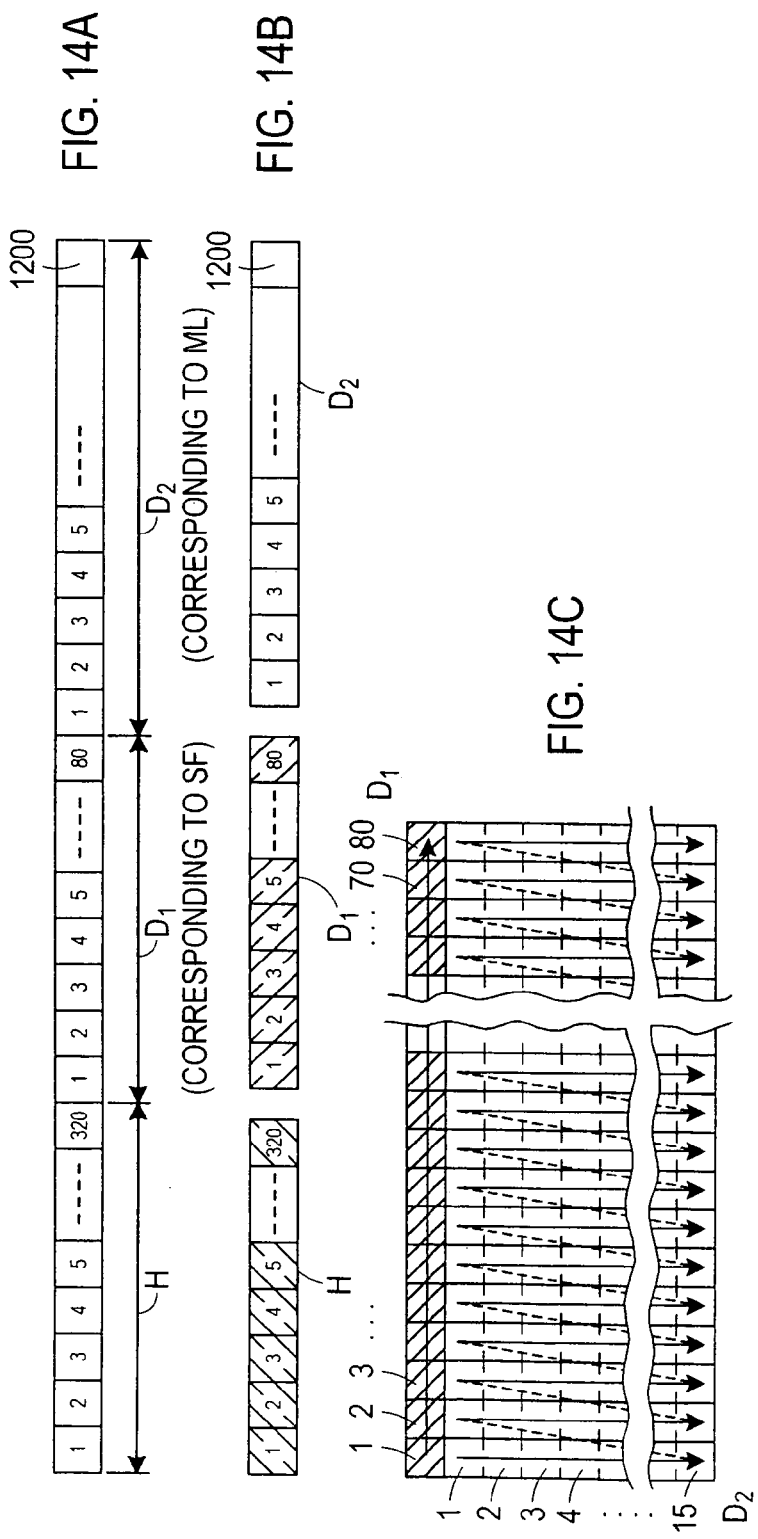
FIGS. 14A-14E are time charts showing the operation of said embodiment.

First, the content of the frame to be transmitted is as already seen for reference in FIG. 14A.

As shown in FIG. 14B, this frame is separated into the header H, the data $D_1$, and the data $D_2$. In this example, the header has 320 bits, the data $D_1$ has 80 bits, and the data $D_2$ has 1,200 bits.

As shown in FIG. 14C, interleaving is performed by the processing part $200_3$ by scattering and arranging the 80 bits forming the data $D_1$ at equal intervals in the bit sequence of 1,200 (15×80) bits forming the data $D_2$, using a continuous storage area of 80×(15+1) bits in the operating memory.

This storage area for interleaving is represented two-dimensionally in FIG. 14C.

First, as shown in FIG. 14C, the 80 bits forming the data $D_1$ are written to a storage area of 80 units corresponding to the first row of the operating memory.

Next, the initial 15 bits in the data $D_2$ are written in the 15-unit storage area corresponding to rows 2-16 of the first column of the operating memory, and the next 15 bits are written in a 15-unit storage area corresponding to rows 2-16 of the second column, and so forth, until the final (i.e., the $80^{th}$) 15 bits are written in a 15-unit storage area corresponding to rows 2-16 of the $80^{th}$ column.

Then, 16 bits are read from each storage area corresponding to rows 1-16 of the first column of the operating memory, and 16 bits are read from each storage area corresponding to rows 1-16 of the second column, and so forth, until the final 16 bits are read from each storage area corresponding to rows 1-16 of the $80^{th}$ column.

Accordingly, as shown in FIG. 14D, the bits forming the data $D_1$ are scattered and arranged in equal intervals in the bit sequence of the data $D_2$, yielding a bit sequence of 1,280 bits, which is output to the processing part $200_4$.

The processing part $200_4$ performs interleaving by scattering and arranging the 320 bits forming the header H at equal intervals within the 1,280 (4×320) bits output by the processing part $200_3$.

Interleaving by the processing part $200_4$ yields the bit sequence of 1,600 bits shown in FIG. 14E.

This bit sequence is transmitted to the receiving side device as a frame after interleaving.

The above is a detailed description of an interleaving device relating to the present embodiment.

Figure 16:
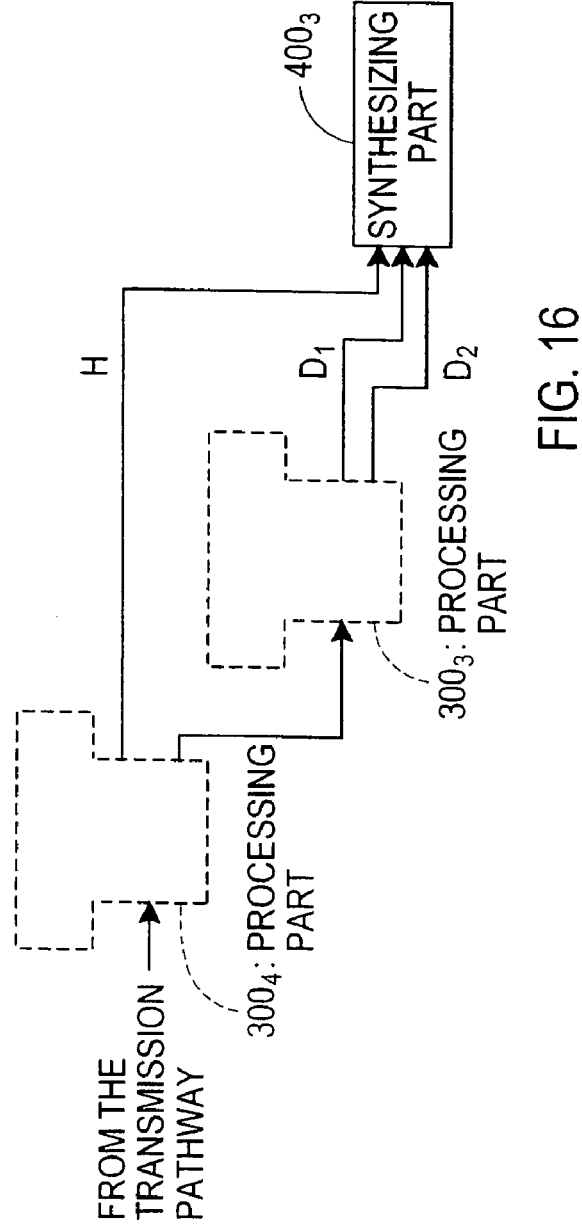
FIG. 16 is a block diagram showing a configuration of a de-interleaving device relating to said embodiment.

De-interleaving of received frames is executed by the receiving side device, using the de-interleaving device shown in FIG. 16.

This de-interleaving device consists of the two processing parts $300_4$ and $300_3$, and the synthesizing part $400_3$.

The processing parts $300_3$ and $300^4$ each possess the same configuration as the de-interleaving device 2 (see FIG. 6) of the first embodiment. The synthesizing part $400_2$ has the same function as the synthesizing part $400_2$ of the second embodiment.

De-interleaving of the received frame is performed by this de-interleaving device, yielding the header H, the data $D_1$, and the data $D_2$ with their bits arranged in their original sequence.

The reproduction of audio signals is also carried out based on the header H, the data $D_1$, and the data $D_2$.

Specifically, first, the data needed for decoding, such as the initial scale factor gain data (scale factors SF of bands 1 and n) and the effective scale factor band number, are taken from the header H.

Next, the differential between the scale factors SF of the various bands is determined from the various RVLC contained in the data $D_1$, and the scale factor SF for each band 1-n is decoded, using these differentials and the initial scale factor gain data. In this case, since decoding from low frequency to high frequency and decoding from high frequency to low frequency are both possible, the scale factor SF of a large number of bands can be decoded, even when signal errors occur in either type of RVLC.

That is to say, if, for example, the differential needed to determine the scale factor SF for the high-frequency bands n-1 cannot be obtained due to a signal error, then the scale factor SF of band 2 is determined by adding the differential between the scale factors for bands 1 and 2 to the scale factor SF (initial scale gain data) of band 1, after which the scale factor SF of band 3 is determined by adding to the aforementioned sum the differential of the scale factors of band 2 and 3, and so forth, so as to determine the scale factors SF for all for all bands, from the low-frequency side to the high-frequency side. By contrast, in cases where, for example, the differential needed to determine the scale factor SF of the low-frequency band 2 cannot be obtained due to a signal error, the differential between the scale factors of band n-1 and n is subtracted from the scale factor SF (initial scale gain data) of band n, after which the scale factor SF of the band n-3 is determined by subtracting the differential between the scale factors of band n-3 and n-2 from the aforementioned result of subtraction, and so forth, so as to determine the scale factors SF for all bands, from the high-frequency side to the low-frequency side.

Next, the scale factors SF for the various bands and the spectral data ML for the various MDCT coefficients of the bands included in the data $D_2$, are substituted into Formula (1) above, so as to regenerate the various MDCT coefficients X belonging to the bands.

Moreover, in cases where the scale factor SF cannot be decoded due to a signal error, concealment is implemented on the band corresponding to the scale factor SF. In other words, the spectral data ML is set at "0" in relation to said band.

Next, in addition to implementing reverse MDCT conversion on the MDCT coefficient X, the audio signal is regenerated based on the results of the reverse MDCT conversion and the header data.

The above is a description of the operation of the receiving side device.

A description of the advantageous effects of the present embodiment follows.

In order to more properly understand the advantageous effects of the present embodiment, first of all, a comparative example will be provided describing an interleaving method other than the interleaving method of the present embodiment, and an explanation of resistance to signal errors is provided for the case where this method is employed. After that, a comparison will be made with the present embodiment, and an explanation of resistance to signal errors is provided for the case where the present embodiment is employed.

First is given Comparative Example 1, which is an interleaving method other than that of the present embodiment. As in the above-described first embodiment, the case is considered where the bits forming the header H that has undergone error correction encoding are scattered in the bit sequence corresponding to both the data $D_1$ and $D_2$ that have not undergone error correction encoding. It should be noted that for the sake of convenience in making a comparison with the present embodiment, the header H shall have a bit length of 320 bits, the data $D_1$ shall have a bit length of 80 bits, and the data $D_2$ shall have a bit length of 1,200 bits.

As shown in FIG. 17A, interleaving in this case is performed using a continuous storage area of 320×(1200+1) units in the operating memory.

FIG. 17A is a two-dimensional representation of the storage area used for interleaving.

First, as shown in FIG. 17A, the 320 bits forming the header H are written to the 320 units of storage area corresponding to the first row of the operating memory.

Next, the initial 4 bits in the data $D_1$ are written to the 4 units of storage area corresponding to rows 2-5 of column 1 of the operating memory, then the next 4 bits are written into the 4 units of storage area corresponding to rows 2-5 of column 2, and so forth, until the final 4 bits are written to the 4 units of storage area corresponding to rows 2-5 of column 20.

Accordingly, once writing of the 80 bits forming the data $D_1$ is finished, writing of the 1,200 bits forming the data $D_2$ is then executed. That is to say, the initial 4 bits in the data $D_2$ are written to each storage area corresponding to rows 2-5 of column 21, the next 4 bits are written to each storage area corresponding to rows 2-5 of column 22, and so forth, until the final 4 bits are written to each storage area corresponding to rows 2-5 of column 320.

Thus, once the writing of the bits forming the header H, the data $D_1$, and the data $D_2$ to the operating memory is finished, the bits stored in the operating memory are read in an order that differs from when they were written. That is to say, 5 bits are read from each storage area corresponding to rows 1-5 of column 1 of the operating memory, then 5 bits are read from each storage area corresponding to rows 1-5 of column 2, and so forth, until the final 5 bits are read from each storage area corresponding to rows 1-5 of column 320.

Accordingly, the 320 bits forming the header H are scattered and arranged at equal intervals in the 1,280-bit bit sequence forming the data $D_1$ and the data $D_2$, resulting in a bit sequence of 1,600 bits, which is transmitted to the receiving side device via the transmission pathway.

Let us suppose that a burst error occurs in the process of transmission, as shown in FIG. 17B. In the example depicted in FIG. 17B, the 5 bits from the 9th to the 13th bit of the 320 bits forming the header H, plus several continuous bits forming the data $D_1$ are compromised by a burst error.

Here, in connection with the header H, randomization is implemented through interleaving, and the effect of the burst error is manifest in the form of random signal errors. Therefore, as long as the number of erroneous bits [4 bits in the example shown in FIG. 17B] is within the error correcting capacity, the signal error can be corrected in the receiving side device.

At the same time, in the example shown in FIG. 17B, the data $D_1$, which includes the RVLC needed to sequentially determine the scale factor SF of each band, is compromised by a burst error.

Here, the MDCT coefficient X for each scale factor band is generated, based on the spectral data ML and scale factor SF recovered by the receiving side device. Therefore, when a burst error occurs in either the data $D_1$ or in the data $D_2$, it becomes impossible to decode the scale factor band corresponding to the erroneous part, even if there are no errors in the other.

Moreover, in the example depicted in FIG. 17B, an error has occurred in the bit sequence of the data $D_1$, that is to say, in the continuous bit sequence from the 19th bit to the 38th bit of the bit sequence of the RVLC needed to determine the scale factor SF of each band. Thus, the entire scale factor band that needs the RVLC where the signal error occurred for decoding the scale factor SF becomes an undecodable sector. As shown in FIG. 17B, when an error occurs in a large number of bit sequences among the RVLC bit sequence, a decodable period arises that includes a large number of bands, as shown in FIG. 17C.

Comparative Example 2 will now be described. In this Comparative Example 2, interleaving is performed on a frame by means of an interleaving device of the type shown in FIG. 15. However, the interleaving performed according to this Comparative Example 2, differs from the interleaving performed according to the present embodiment.

Figure 18A:
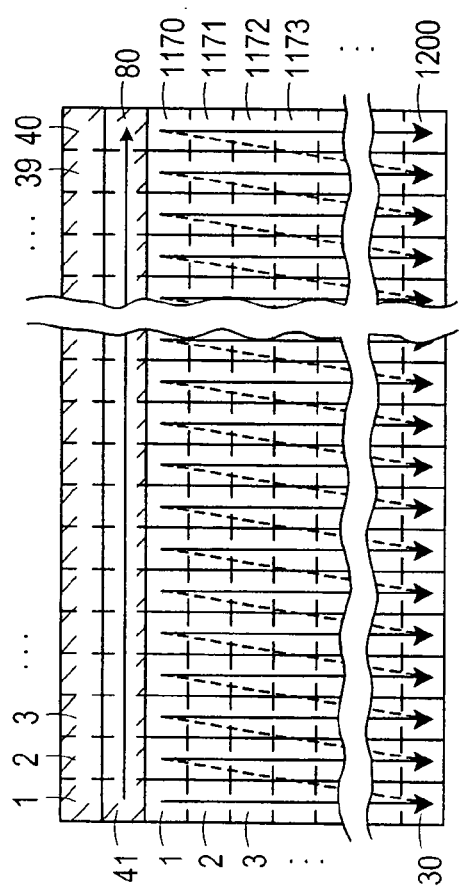
FIGS. 18A-18C are diagrams describing the interleaving method in Comparative Example 2 presented in contrast to said embodiment, and the resistance to signal errors of said of said method.

In this Comparative Example 2, as shown in FIG. 18A, the processing part $200_3$ writes the 80 bits forming the data $D_1$ needed to decode the scale factor SF, dividing them into 40 bits each for row 1 and row 2 of the operating memory. Next, the processing part $200_3$ writes the initial 30 bits of the 1,200 bits forming the data $D_2$ to each storage area covering row 3 to row 32 of column 1 of the operating memory, and then writes the next 30 bits to each storage area covering row 3 to row 32 of column 2, and so forth, until writing the final 30 bits to each storage area covering row 3 to row 32 of column 40. Then, once this writing is completed, the processing part $200_3$ reads 32 bits from each storage area from rows 1-32 of column 1, then reads the 32 bits from each storage area from rows 1-32 of column 2, and so forth, until the final 30 bits are read from each storage area from rows 1-32 of column 40. Then, the processing part $200_3$ delivers to the processing part $200_4$ a bit sequence of the 1,280 bits that were read in the described manner.

Next, the processing part $200_4$ performs interleaving by scattering and arranging the 320 bits forming the header H at equal intervals in the bit sequence of the 1,280 bits output from the processing part $200_3$.

Figure 18B:
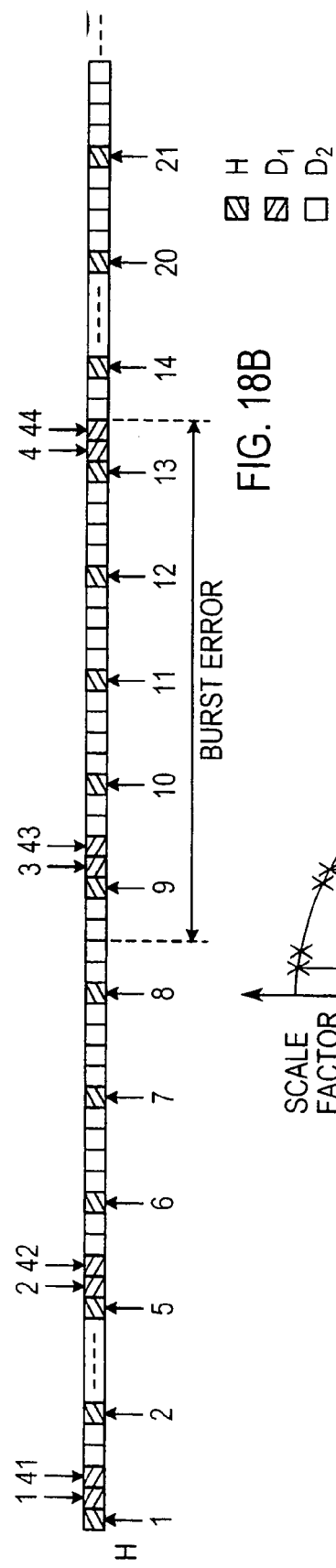

FIG. 18B shows the configuration of a bit sequence resulting from this interleaving.

This bit sequence is transmitted to the receiving side device as an interleaved frame.

In the process of transmitting this frame, a burst error occurs as shown in FIG. 18B.

In the example depicted in FIG. 18B, the 3rd bit, 4th bit, 43rd bit, and 44th bit of the data $D_1$ needed for decoding the scale factor SF, are compromised by the burst error. The scale factor bands that cannot decode the scale factor SF due to these bit errors form an undecodable sector.

Incidentally, an RVLC is used to encode the scale factor SF, and the scale factor SF corresponding to band 1 with the lowest frequency and the scale factor SF corresponding to band n with the highest frequency are included in the header H as initial spectral gain data. Therefore, when a signal error occurs in the RVLC corresponding to a high frequency band, decoding is carried out from low frequency toward high frequency, and conversely, when signal errors occur in RVLC corresponding to low-frequency bands, the scale factor SF of a very wide range of bands can be recovered by decoding from high frequency toward low frequency.

However, when interleaving is performed as described above out by writing the bits forming the data $D_1$ to each storage area corresponding to a plurality of rows in the operating memory, the bits forming each RVLC needed to decode the scale factor SF in the frame after interleaving appear as 2 continuous bits [see FIG. 18B]. Accordingly, there is an increase in the number of bits compromised by the burst error among the bit needed to decode the scale factor SF. Moreover, it is highly probable that the various RVLCs corresponding to 2 or more bands that are separated on the frequency axis among the component bits of the various RVLCs needed to decode the scale factor SF will be compromised by the burst error.

Figure 18C:
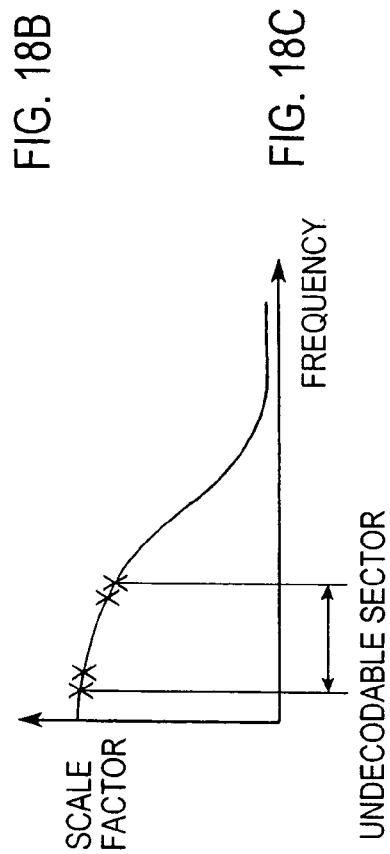

In addition, when a signal error occurs in the component bits of the various RVLCs corresponding to a plurality of bands separated on the frequency axis, the sector from the band with the lowest frequency to the band with the highest frequency becomes an undecodable sector, as shown in FIG. 18C.

Figure 19A:
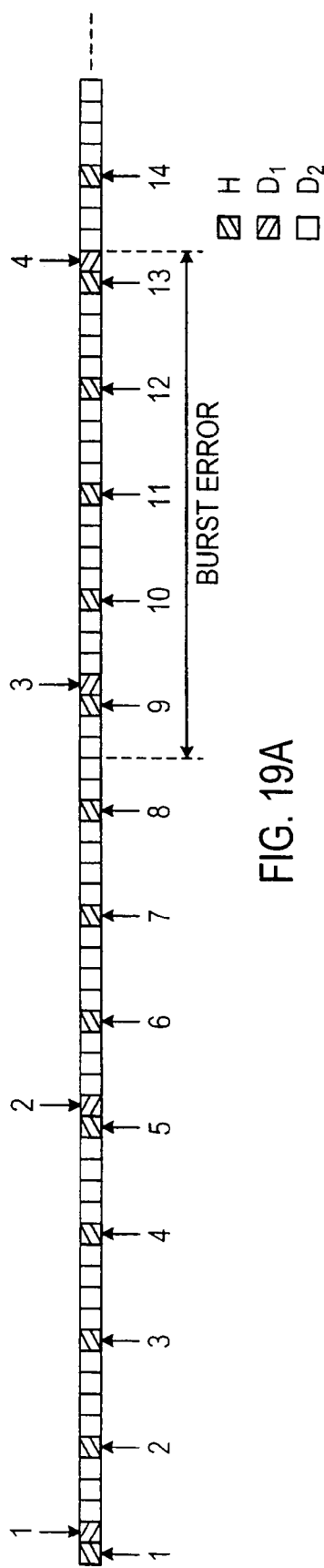
FIGS. 19A and 19B are diagrams describing the resistance to signal errors of the interleaving method of said embodiment.
Figure 19B:
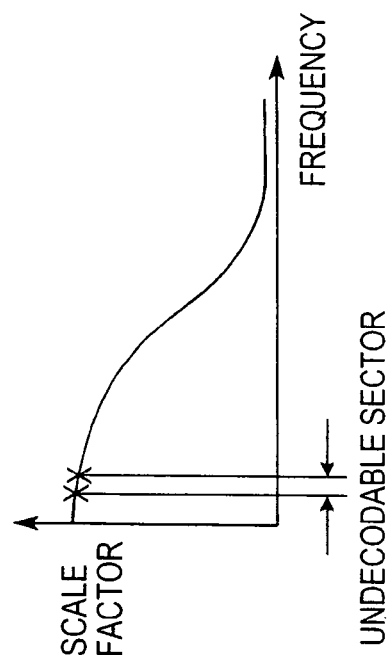
Figure 20:
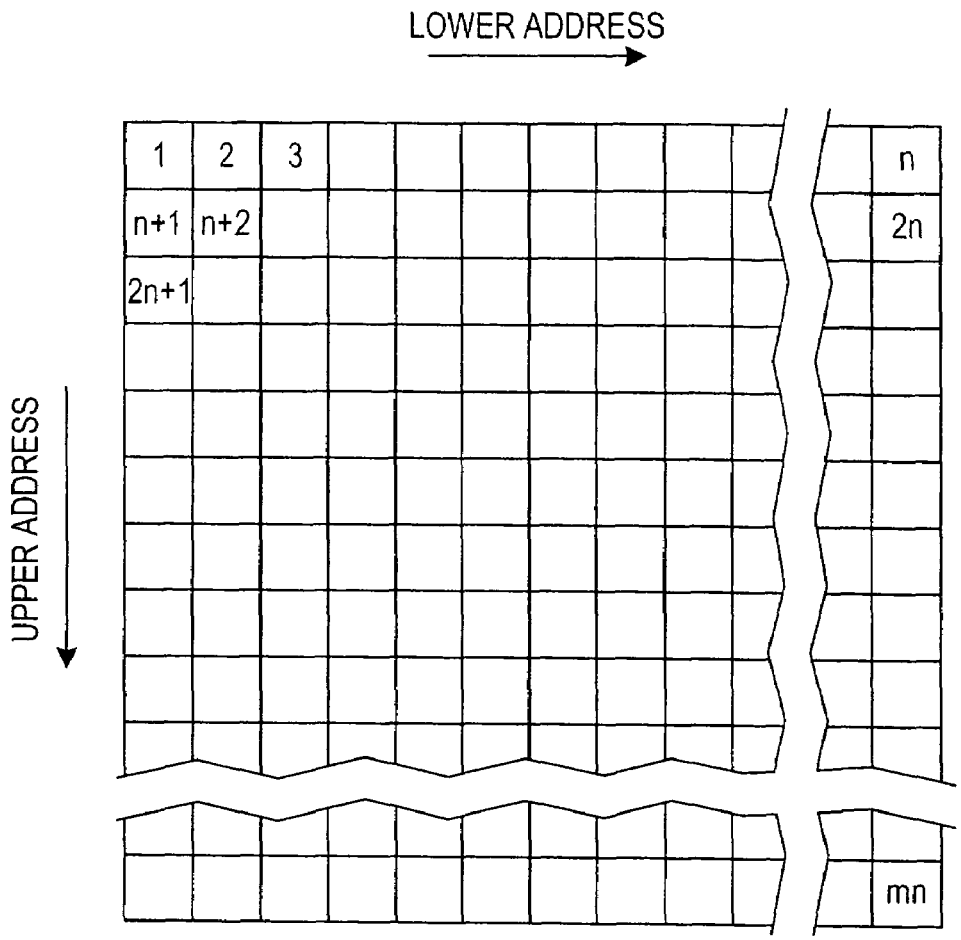
FIG. 20 is a two-dimensional drawing illustrating the storage area of memory used in interleaving.
Figure 21:
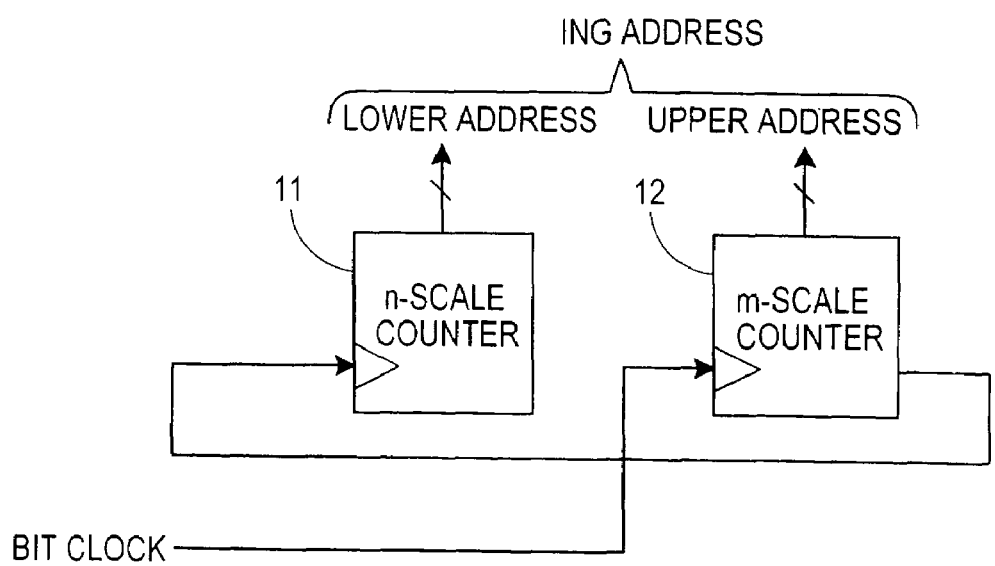
FIG. 21 is block diagram showing an example of the configuration of a device that generates writing addresses to memory during interleaving.
Figure 22:
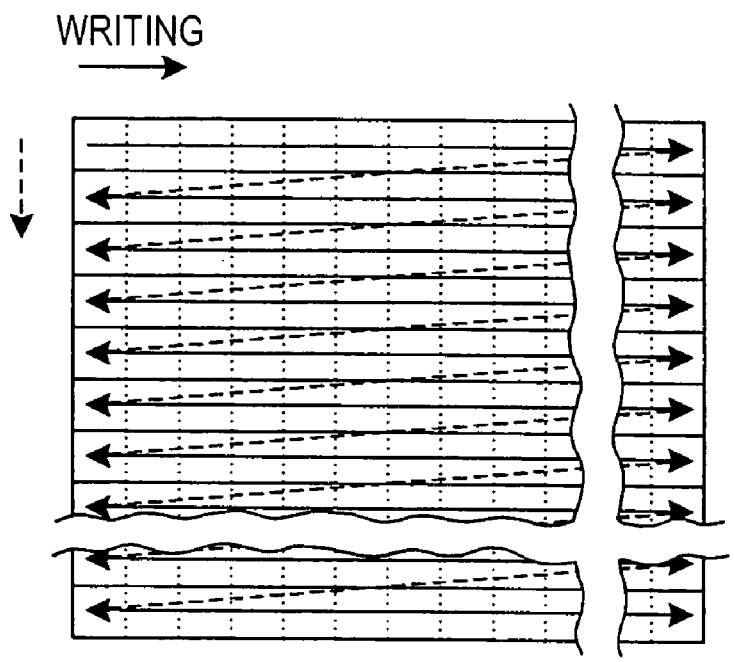
FIG. 22 is a diagram showing the writing sequence of bits forming a frame into the storage area of memory during interleaving.
Figure 23:
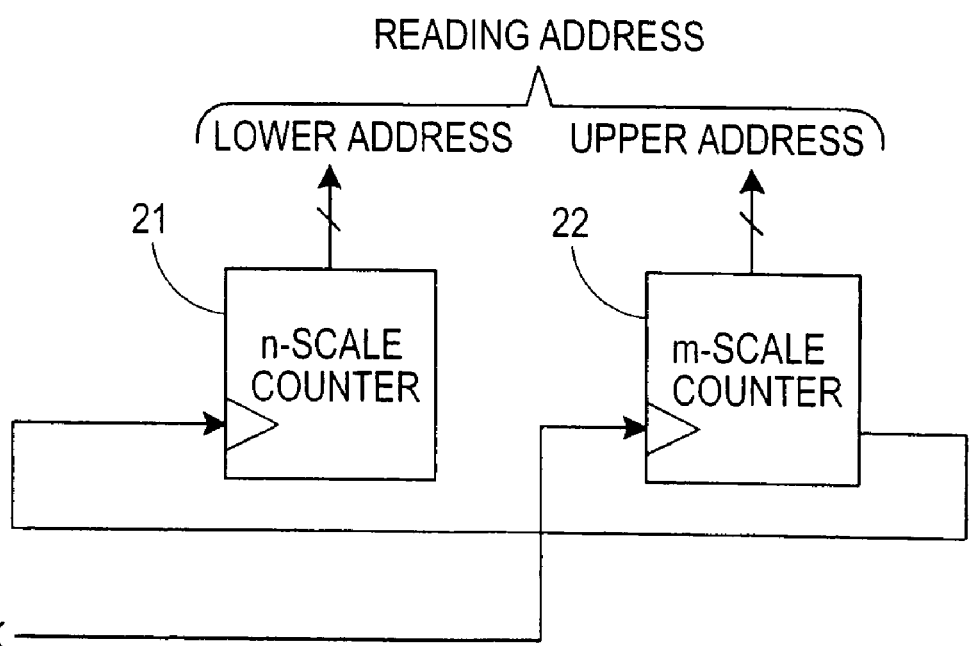
FIG. 23 is a block diagram showing a configuration of a device that generates reading addresses to memory during interleaving.
Figure 24:
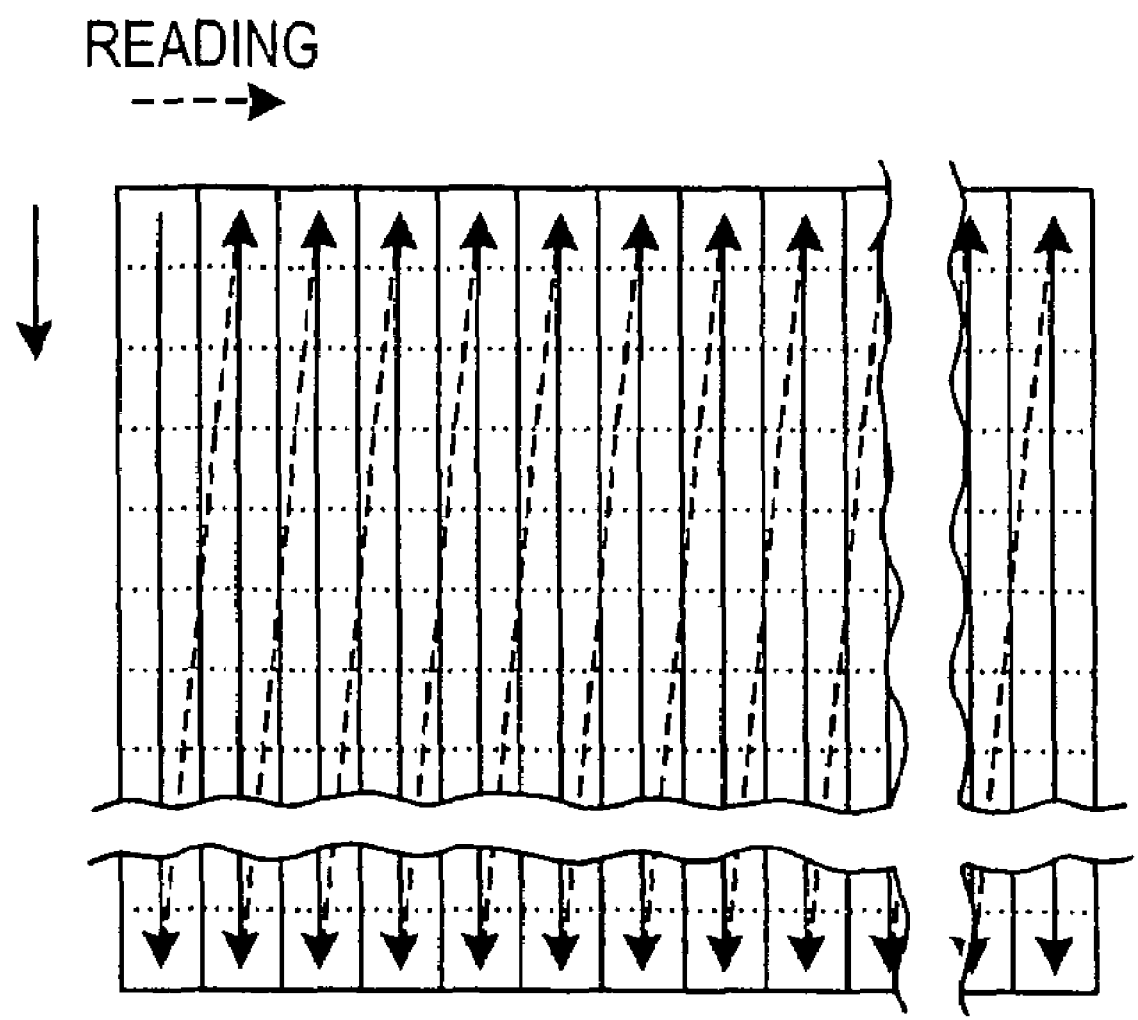
FIG. 24 is a diagram showing the sequence for reading bits forming a frame from the storage area of memory during interleaving.

In contrast to Comparative Examples 1 and 2, the present embodiment is able to scatter the component bits of the RVLC needed to decode the scale factor SF, arranging them at equal intervals in the frame, since all bits forming the data $D_1$ corresponding to the scale factor SF are written to the first row of the operating memory, when interleaving is performed in the processing part $200_3$. Furthermore, the component bits of the RVLC needed to decode the scale factor SF of each band have the same sequence as the sequence of each band on the frequency axis, appearing -in the bit sequence after interleaving. Therefore, even if a burst error such as shown in FIG. 19A occurs in a frame during transmission, nothing more will happen than that it will be impossible to decode the scale factor SF corresponding to the neighboring band on the frequency axis. It is therefore possible to shorten undecodable sectors accompanying a loss of the scale factor SF, as shown in FIG. 19B.

In accordance with the present embodiment, in cases where there is a header H that has undergone error correction encoding, and the data $D_1$ and $D_2$ that have not undergone error correction encoding, the bits for decoding the scale factor SF contained in the data $D_1$ are scattered and arranged in the data $D_2$, and moreover, the bits forming the header H are scattered and arranged in the resulting bit sequence, so that even if a burst error occurs, it is possible to reduce the probability that the scale factor SF will become undecodable, thereby enhancing the quality of the reproduced audio signals.

Moreover, since the various bits are written only into the first row of the operating memory when the bits needed for decoding the scale factor SF are scattered and arranged, the bits needed to decode the scale factor SF of the various bands are scattered and arranged in the frame in an order identical to the order of the bands on the frequency axis.

Therefore, even if a burst error occurs, it is possible to concentrate on the frequency axis the scale factor SF that can get lost. Thus, undecodable bands can be concentrated into a very narrow range. As a result, the quality of the reproduced audio signals can be enhanced.

D. Variations On The Above-Described Embodiments

The interleaving device and de-interleaving device relating to embodiments 1-3 can be realized with the depicted hardware configuration, or with a software configuration for executing a program for am operation similar to the one described above.

Furthermore, in the above-described embodiment, bits forming the header H that had not undergone error correction encoding were scattered, arranging them in a bit sequence of data that had not undergone error correction encoding, but the present invention is not limited to this, and the above-described interleaving and de-interleaving can, of course, also be applied to parts that have not undergone error correction encoding.

Also, in the third embodiment, an example was given of the case where the present invention was applied to 3 parameters that represent 1 signal, but the present invention is not limited thereto, and it is of course also permitted for 1 signal to be represented by 4 or more parameters. In this case, interleaving can be performed by scattering and arranging the bits corresponding to some parameters in a bit sequence corresponding to one of the remaining parameters, and performing multiple repetitions of this scattering corresponding to the number of types of parameters.

The invention claimed is:

1. A multi-stage interleaving device comprising:
    (a) N units of processing parts arranged in tiers of N from a bottom to a top, wherein N is an integer greater than 1, each processing part comprising:
        an operating memory configured to provide a matrix of storage areas having columns and rows;
        first and second input terminals configured to receive a first stream of bits and a second stream of bits, respectively;
        a data writer configured to write the first stream of bits in storage areas in the matrix, starting from a top row of the matrix towards a bottom thereof, in a row direction from a left most storage area to right; and write the second stream of bits to fill unfilled storage areas in the matrix, starting from a left most column to right, in a column direction from a top unfilled storage area of each column towards the bottom;
        a data reader configured to read the bits of the first and second streams written in the matrix, starting from the left most column to right, in the column direction from a top storage area of each column towards the bottom to output a third steam of bits in which the bits of the first stream are scattered into the second stream at intervals; and
        an output terminal configured to output the third stream of bits, and
    (b) a plurality of connections for inputting and outputting streams of bits in and from the processing parts, comprising:
        N+1 lines of input connections configured to provide two streams of input bits to the first and second input terminals of the processing part located at the bottom tier and provide N−1 streams of input bits respectively to the first input terminals of the remaining processing parts located above the bottom tier; and
        N−1 lines of output connections configured to provide the third steam of bits from the output terminal of a processing part to the second input terminal of the processing part located one tier above.

2. A multi-stage interleaving device according to claim 1, wherein the matrix is configured such that the row is equal in length to the first stream.

3. A multi-stage interleaving device according to claim 1, wherein the first stream of bits ($X_i$) and the third stream of bits ($Z_k$) have the following relationship:

$$k = (i \bmod W) \times D + \left[\frac{i}{W}\right]$$

where $Z_k$ is the k-th bit in the third stream ($0 \leq k$); $X_i$ is the i-th bit in the first stream ($0 \leq i$); W is a length of the row of the matrix; and D is a length of the column of the matrix.

4. A multi-stage interleaving device according to claim 1, wherein the matrix is sized equal to total lengths of the first and second bit streams.

5. A multi-stage interleaving method comprising:
    (a) providing a matrix of storage areas having rows and columns;
    (b) writing a first stream of bits in storage areas in the matrix, starting from a top row in the matrix towards a bottom thereof, in a row direction from a left most storage area to right;
    (c) writing a second stream of bits to fill unfilled storage areas in the matrix, starting from a left most column to right, in a column direction from a top unfilled storage area of each column towards the bottom;
    (d) reading the bits of the first and second streams written in the matrix, starting from the left most column to right, in the column direction from a top storage area of each column towards the bottom to output a third stream of bits in which the bits in the first stream are scattered into the second stream at intervals; and
    (e) repeating steps (a)-(d), wherein the third stream of bits is written in the matrix as one of the first and second streams of bits and a new stream of bits is written in the matrix as the other of the first and second streams of bits.

6. A multi-stage interleaving method according to claim 5, wherein the matrix is configured such that the row is equal in length to the first stream.

7. A multi-stage interleaving method according to claim 5, wherein the first stream of bits ($X_i$) and the third stream of bits ($Z_k$) have the following relationship:

$$k = (i \bmod W) \times D + \left[\frac{i}{W}\right]$$

where $Z_k$ is the k-th bit in the third stream ($0 \leq k$); $X_i$ is the i-th bit in the first stream ($0 \leq i$); W is a length of the row of the matrix; and D is a length of the column of the matrix.

8. A multi-stage interleaving method according to claim 5, wherein the matrix is sized equal to total lengths of the first and second bit streams.

* * * * *